United States Patent
Dobberpuhl et al.

(10) Patent No.: US 8,134,356 B2
(45) Date of Patent: Mar. 13, 2012

(54) OPERATING AN INTEGRATED CIRCUIT AT A MINIMUM SUPPLY VOLTAGE

(75) Inventors: Daniel W. Dobberpuhl, Menlo Park, CA (US); Vincent R. von Kaenel, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/046,103

(22) Filed: Mar. 11, 2011

(65) Prior Publication Data

US 2011/0156693 A1    Jun. 30, 2011

Related U.S. Application Data

(63) Continuation of application No. 12/634,373, filed on Dec. 9, 2009, now Pat. No. 7,928,747, which is a continuation of application No. 11/753,853, filed on May 25, 2007, now Pat. No. 7,652,494, which is a continuation-in-part of application No. 11/173,684, filed on Jul. 1, 2005, now Pat. No. 7,276,925.

(51) Int. Cl.
*G01R 23/02* (2006.01)

(52) U.S. Cl. ........ 324/76.39; 324/762.01; 365/227; 714/733; 327/156; 327/540

(58) Field of Classification Search ........ 324/762.01–762.02, 76.11, 76.39; 365/227; 714/733; 702/64; 327/156, 524, 327/530, 540; 323/318; 713/300
See application file for complete search history.

(56) References Cited

U.S. PATENT DOCUMENTS

| | | | |
|---|---|---|---|
| 5,440,520 A | 8/1995 | Schutz et al. | |
| 5,682,118 A | 10/1997 | Kaenel et al. | |
| 5,712,589 A | 1/1998 | Afek et al. | |
| 5,856,766 A | 1/1999 | Gillig et al. | |
| 6,078,634 A | 6/2000 | Bosshart | |
| 6,154,095 A | 11/2000 | Shigemor et al. | |
| 6,157,247 A | 12/2000 | Abdesselem et al. | |
| 6,188,252 B1 | 2/2001 | Kawakami | |
| 6,366,157 B1 | 4/2002 | Abdesselem et al. | |
| 6,664,775 B1 | 12/2003 | Clark et al. | |
| 6,762,629 B2 | 7/2004 | Tam et al. | |
| 6,809,606 B2 | 10/2004 | Wong et al. | |
| 6,874,083 B2 | 3/2005 | Sarangi et al. | |

(Continued)

OTHER PUBLICATIONS

Vincent Von Kaenel, et al., "A Voltage Reduction Technique for Batter-Operated System," IEEE Journal of Solid-State Circuits, vol. 25, No. 5, Oct. 19990, 5 pages.

(Continued)

*Primary Examiner* — Arleen M Vazquez
(74) *Attorney, Agent, or Firm* — Lawrence J. Merkel; Meyertons, Hood, Kivlin, Kowert & Goetzel, P.C.

(57) ABSTRACT

In one embodiment, an integrated circuit comprises at least one measurement unit configured to generate an output indicative of a supply voltage at which the integrated circuit is operable for a given operating frequency and a control unit coupled to receive the output. The control unit is configured to generate a voltage control output indicative of a requested supply voltage for the integrated circuit responsive to the output. The voltage control output may be output from the integrated circuit for use by circuitry external to the integrated circuit in generating the supply voltage for the integrated circuit.

29 Claims, 13 Drawing Sheets

U.S. PATENT DOCUMENTS

| | | |
|---|---|---|
| 6,903,964 B2 | 6/2005 | Naha et al. |
| 7,071,768 B2 | 7/2006 | Abe et al. |
| 7,084,710 B2 | 8/2006 | Huang |
| 7,276,925 B2 | 10/2007 | Dobberpuhl et al. |
| 7,319,358 B2 | 1/2008 | Senthinathan et al. |
| 7,652,494 B2 | 1/2010 | Dobberpuhl et al. |
| 7,898,285 B2 | 3/2011 | Bernstein et al. |
| 7,928,747 B2 | 4/2011 | Dobberpuhl et al. |
| 2002/0135343 A1 | 9/2002 | Underbrink et al. |
| 2003/0206071 A1* | 11/2003 | Wong et al. .................. 331/176 |
| 2005/0188230 A1 | 8/2005 | Bilak |
| 2005/0206463 A1 | 9/2005 | Godambe et al. |
| 2005/0283630 A1 | 12/2005 | Shikata |
| 2006/0074576 A1 | 4/2006 | Patel et al. |
| 2006/0259840 A1 | 11/2006 | Wagdi et al. |
| 2008/0282102 A1 | 11/2008 | Reddy et al. |
| 2008/0297233 A1 | 12/2008 | Tokunaga |
| 2009/0016140 A1 | 1/2009 | Qureshi et al. |

OTHER PUBLICATIONS

Christopher Poirier, et al., "Power and Temperature Control on a 90nm Itanium-Family Processor," 2005 IEEE International Solid-State Circuits Conference, 2 pages.

Tim Fischer, et al., "A 90nm Variable-Frequency Clock System for a Power-Managed Itanium-Family Processor," 2005 IEEE International Solid-State Circuits Conference, 3 pages.

"CVD Circuit and Operation," ISSCC 2005, Paper 16.2, ISSCC Visuals Supplement, p. 617.

"Impact of Double Switch Scheme," ISSCC 2005, Paper 16.7, ISSCC Visuals Supplement, p. 623.

Office Action from U.S. Appl. No. 12/361,405 mailed on Jun. 25, 2010, 7 pages.

Office Action from U.S. Appl. No. 13/032,052, mailed Jun. 10, 2011, Apple Inc., all pages.

* cited by examiner

US 8,134,356 B2

OPERATING AN INTEGRATED CIRCUIT AT A MINIMUM SUPPLY VOLTAGE

This application is a continuation of U.S. patent application Ser. No. 12/634,373 filed on Dec. 9, 2009 now U.S. Pat. No. 7,928,747, which is a continuation of U.S. patent application Ser. No. 11/753,853 filed on May 25, 2007 now U.S. Pat. No. 7,652,494, which is a continuation in part of U.S. patent application Ser. No. 11/173,684 filed on Jul. 1, 2005 now U.S. Pat. No. 7,276,925, which is incorporated herein by reference in its entirety.

BACKGROUND

1. Field of the Invention

This invention is related to the field of integrated circuits and, more particularly, to controlling supply voltage to an integrated circuit.

2. Description of the Related Art

As the number of transistors included on a single integrated circuit "chip" has increased and as the operating frequency of the integrated circuits has increased, the management of power consumed by an integrated circuit has continued to increase in importance. If power consumption is not managed, meeting the thermal requirements of the integrated circuit (e.g. providing components required to adequately cool the integrated circuit during operation to remain within thermal limits of the integrated circuit) may be overly costly or even infeasible. Additionally, in some applications such as battery powered devices, managing power consumption in an integrated circuit may be key to providing acceptable battery life.

Power consumption in an integrated circuit is related to the supply voltage provided to the integrated circuit. For example, many digital logic circuits represent a binary one and a binary zero as the supply voltage and ground voltage, respectively (or vice versa). As digital logic evaluates during operation, signals frequently transition fully from one voltage to the other. Thus, the power consumed in an integrated circuit is dependent on the magnitude of the supply voltage relative to the ground voltage. Reducing the supply voltage generally leads to reduced power consumption, but also impacts the speed at which digital circuits operate and thus may cause incorrect operation at a given operating frequency (that is, the frequency at which digital logic in the integrated circuit is clocked).

Additionally, as transistor geometries have continued to decrease in size, leakage currents that occur when a transistor is not actively conducting current have become a larger component of the power consumed in the integrated circuit. The amount of leakage current experienced in a given transistor generally increases exponentially as the supply voltage increases.

Thus, power consumption in an integrated circuit may be managed by lowering the supply voltage to the integrated circuit, but incorrect operation may also result if the supply voltage is reduced too far. The supply voltage magnitude at which incorrect operation occurs for a given operating frequency varies on part-by-part basis for a given integrated circuit design. For example, variations in the integrated circuit manufacturing process used to manufacture the integrated circuit and the operating temperature of the integrated circuit may both impact the supply voltage magnitude at which incorrect operation occurs. Accordingly, attempts to manage power consumption via the supply voltage have been limited to supply voltage magnitudes that ensure correct operation at the given frequency across all acceptable variations in the manufacturing process and all permissible operating temperatures. Typically, the supply voltage for a given frequency is statically specified in the integrated circuit's specification.

SUMMARY

In one embodiment, an integrated circuit comprises at least one measurement unit and a circuit. The measurement unit is configured to generate an output indicative of a supply voltage at which the integrated circuit is operable for a given operating frequency. Coupled to receive the output from the measurement unit, the circuit is configured to filter the output and to generate a voltage control output for an external voltage regulator responsive to the filtered output. The voltage control output indicates a requested supply voltage for the integrated circuit, and the requested supply voltage differs from a current supply voltage to the integrated circuit if the filtered output indicates that the current supply voltage is to be changed for the given operating frequency.

In another embodiment, an integrated circuit comprises at least one measurement unit and a circuit coupled thereto. The measurement unit is configured to generate an output indicative of a supply voltage at which the integrated circuit is operable for a given operating frequency. The circuit is configured to indicate the given operating frequency to the measurement unit, and to determine the given operating frequency responsive to a requested operating frequency. The given operating frequency is greater than the requested operating frequency by a frequency margin implemented by the circuit.

In yet another embodiment, a system comprises an integrated circuit coupled to a voltage regulator. The integrated circuit is configured to measure a supply voltage at which the integrated circuit is operable for a given operating frequency. Specifically, the integrated circuit is configured to generate the measured supply voltage on an output of the integrated circuit. Coupled to receive the measured supply voltage from the integrated circuit, the voltage regulator is configured to generate a regulated supply voltage for the integrated circuit responsive to the measured supply voltage.

In an embodiment, an apparatus for measuring a supply voltage at which an integrated circuit is operable for a given operating frequency comprises a first circuit comprising one or more phase lock loop (PLL) components and excluding a voltage control oscillator (VCO), wherein the first circuit is configured to output a control voltage generated by the PLL components. The apparatus further comprises a plurality of measurement units, each comprising a VCO coupled to receive the control voltage and to generate an oscillator output in response to the control voltage. The first circuit is coupled to receive the oscillator outputs from the plurality of measurement units and is configured to generate the control voltage responsive to the oscillator outputs.

BRIEF DESCRIPTION OF THE DRAWINGS

The following detailed description makes reference to the accompanying drawings, which are now briefly described.

Figure 1:
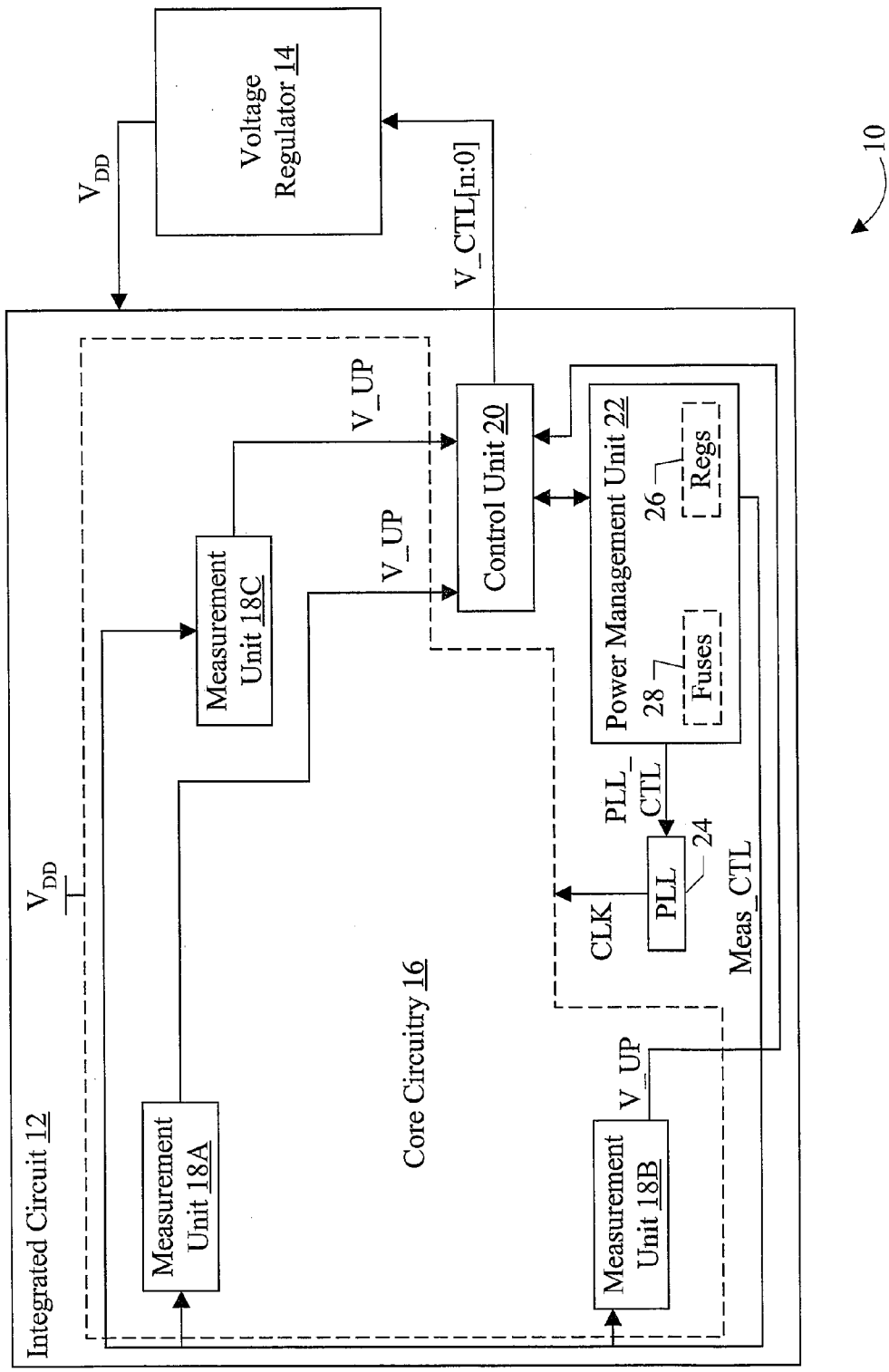
FIG. 1 is a block diagram of one embodiment of an system including an integrated circuit and a voltage regulator.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

FIG. 1 is a block diagram of one embodiment of a system 10 including an integrated circuit 12 and a voltage regulator 14 external to the integrated circuit 12. The integrated circuit 12 is coupled to the voltage regulator 14. Specifically, in the illustrated embodiment, the integrated circuit 12 is coupled to provide a voltage control output (V_CTL[n:0] in FIG. 1) as an input to the voltage regulator 14 and to receive a supply voltage ($V_{DD}$) from the voltage regulator 14. The supply voltage ($V_{DD}$) may be referred to herein as the "current supply voltage" to indicate the supply voltage currently being supplied to the integrated circuit 12. Various embodiments of the system 10 may include any other components coupled to the integrated circuit 12 and/or the voltage regulator 14.

In the illustrated embodiment, the integrated circuit 12 includes core circuitry 16, a plurality of measurement units 18A-18C, a control unit 20, a power management unit (PMU) 22, and a phase locked loop (PLL) 24. The control unit 20 is coupled to provide the V_CTL output to the voltage regulator 14 and is coupled to the measurement units 18A-18C. More particularly, in the illustrated embodiment, the control unit 20 is coupled to receive V_UP signals from each of the measurement units 18A-18C. The control unit is also coupled to the PMU 22. The PMU 22 is further coupled to the PLL 24 (PLL_CTL in FIG. 1) and to the measurement units 18A-18C (Meas_CTL in FIG. 1). The PLL 24 is further configure to provide one or more clock signals (CLK) to clock the core circuitry 16. Generally, unless otherwise indicated, the circuitry in the integrated circuit 12 in the illustrated embodiment is supplied with the current supply voltage ($V_{DD}$) from the voltage regulator 14. For example, the core circuitry 16 is shown as being supplied with the current supply voltage. In FIG. 1, the core circuitry 16 is represented by the dashed enclosure that surrounds the label "core circuitry 16".

The measurement units 18A-18C may be configured to measure a supply voltage at which the integrated circuit will operate correctly for a given operating frequency, and may output an indication of the measured voltage to the control unit 20. The measured voltage may be a "minimum" supply voltage that results in correct operation. That is, the measured voltage may be the lowest measurable voltage that results in correct operation. The minimum supply voltage may not be the absolute minimum at which the integrated circuit is correctly operable (e.g. differences may occur due to measurement error, error in modeling or approximating critical paths in the integrated circuit, guardbanding in the measurement unit design to provide safety margin, etc.). Correct operation of the integrated circuit generally refers to the integrated circuit functioning as designed. Incorrect operation may occur if erroneous results occur as compared to the design of the integrated circuit (e.g. due to a critical path not completing evaluation in time at the current operating frequency). It is noted that, in the present description, voltages may be described as minimum, or voltages may be described as higher or lower than other voltages, or greater than or less than other voltages. Such terminology may refer to the magnitudes of the voltages. More particularly, the measurement units 18A-18C may be configured to continuously measure the supply voltage at which the integrated circuit will operate correctly at the given operating frequency while the integrated circuit is operating at the given operating frequency.

The control unit 20 may generate the V_CTL output to the voltage regulator 14 responsive to the outputs from the measurement units 18A-18C, and the voltage regulator 14 may provide the requested supply voltage to the integrated circuit 12 as the current supply voltage ($V_{DD}$). The integrated circuit 14 may thus by powered at a low supply voltage that still results in correct operation. In some embodiments, the supply voltage may be lower than a supply voltage at which correct operation would be ensured across all manufacturing process variations and all operating temperatures. Instead, the supply voltage may be sufficient for the manufacturing process variations that actually exist in the integrated circuit 12 and the current operating temperature of the integrated circuit 12. The operating temperature may vary over time during operation. Accordingly, the measurement units may continue measuring during operation of the integrated circuit, and may dynamically adjust the supply voltage as operating temperatures vary.

As mentioned above, the measured voltages from the measurement units 18A-18C may be affected by the variations in the manufacturing process used to manufacture the integrated circuit 12. Generally, the manufacturing process involves a set of steps applied to a semiconductor wafer to deposit various materials on the surface of the wafer, remove materials from the surface of the wafer, or implant materials into the wafer. Variations may occur in the amount of material implanted, deposited, or removed. These variations may result in variations in the speed at which the resulting circuitry evaluates when powered with a given supply voltage. Generally, the process variations that actually exist in the integrated circuit 12 may be referred to as the process characteristics for the integrated circuit 12.

Process characteristics and/or operating temperature may also vary somewhat over the surface area of the integrated circuit chip. Thus, in the illustrated embodiment, there may be more than one measurement unit 18A-18C and the measurement units may be physically distributed over the surface area of the chip. Each measurement unit 18A-18C may be affected by the operating temperature and/or process characteristics that are local to the physical area in which that measurement unit 18A-18C is located. In other embodiments, as few as one measurement unit may be provided or any desired number of measurement units may be provided. Generally, the measurement units 18A-18C may be instantiated at various points within the core circuitry 16 as shown in FIG. 1, or may even be instantiated with or near the PLL 24, the PMU 22, and/or the control unit 20.

In the illustrated embodiment, the measurement units 18A-18C may compare the measured voltage to the current supply voltage and may output the V_UP signal responsive to the comparison. The V_UP signal may be asserted to indicate that the measured voltage is greater than the current supply voltage (and thus the current supply voltage is to be increased to provide correct operation). The control unit 20 may generate the voltage control output to select a higher requested supply voltage if at least one of the V_UP signals is asserted. If none of the V_UP signals are asserted, the current supply voltage may be higher than needed and the control unit 20 may decrease the requested supply voltage.

While the illustrated embodiment uses the V_UP signals to communicate with the control unit 20, other embodiments may use any output that is indicative of the measured voltage. For example, an output may be indicative of the measured voltage if it provides an indication of the measured voltage relative to the current supply voltage. In the illustrated embodiment, the V_UP signal, when asserted, indicates that the measured voltage is greater than the current supply voltage and thus the current supply voltage is to be increased. Other output indications may indicate that the measured voltage is less than and/or equal to the current supply voltage. Alternatively, an output may be indicative of the measured voltage if it indicates the magnitude of the measured voltage directly (e.g. the numerical value of the voltage) or may be a value indicating the difference between the current supply voltage and the measured voltage. Other embodiments may provide multiple indications (e.g. a V_UP signal as mentioned above and a V_DOWN signal that indicates the measured voltage is lower than the current supply voltage).

In some cases, the requested supply voltage may be greater than the measured supply voltages from the measurement units 18A-18C. For example, the voltage regulator 14 may support various discrete steps of supply voltage, each of which may be selected with different encodings on the V_CTL input to the voltage regulator 14. The requested supply voltage may be the lowest supported voltage that is greater than or equal to the measured voltage, once the requested supply voltage has stabilized.

As used herein, a measurement unit comprises any circuitry that measures a supply voltage (either directly or indirectly) at which the integrated circuit is expected to operate properly. The measurement unit may be programmable to select an operating frequency for which the supply voltage is determined, in some embodiments. In some embodiments, the measurement unit may include circuitry that models or approximates a critical path delay in the integrated circuit, and measures a supply voltage at which the critical path delay is less than one clock period at a given operating frequency. Other embodiments may measure the supply voltage at which both n-type metal-oxide-semiconductor (NMOS) and p-type metal-oxide-semiconductor (PMOS) transistors achieve a required value of saturation current ($I_{dsat}$). Several example embodiments are shown in FIGS. 5-9 and described in more detail below.

The core circuitry 16 may generally comprise the circuitry that implements the operation for which the integrated circuit 12 is designed. For example, if the design includes one or more processors, the core circuitry 16 may include the circuitry that implements the processor operation (e.g. instruction fetch, decode, execution, and result write). If the design includes a bridge to a peripheral interface, the core circuit 16 may include the circuitry that implements the bridge operation. If the design includes other communication features such as packet interfaces, network interfaces, etc., the core circuitry 16 may include circuitry implementing the corresponding features. The integrated circuit 12 may generally be designed to provide any set of operations.

The core circuitry 16 may include one or more "critical paths". Generally, a path may comprise one or more circuits and interconnect (or "wire") between an input signal and an output signal. Each path may have an associated delay (which may vary based on process characteristics of a given integrated circuit and/or operating temperature of the given integrated circuit). A critical path may have an associated delay that is greater than other paths in the core circuitry 16 (or greater than most other paths). Critical paths may be key to determining if a given operating frequency/supply voltage pair results in correct operation. If the critical paths evaluate properly for the given supply voltage prior to the end of the clock cycle at the given operating frequency, other paths should also evaluate properly.

The core circuitry 16 may be clocked by one or more clocks provided by the PLL 24, which is controlled by the PMU 22 (using the PLL_CTL). For example, the PMU 22 may program the PLL 24 to lock to a desired operating frequency, and may change the desired operation frequency over time to manage power consumption.

The PMU 22 may be configured to communicate with the control unit 20 and optionally with the measurement units 18A-18C to change the operating frequency. If the operating frequency is to be increased, the PMU 22 may first ensure that the supply voltage is raised to a level that supports operation at the increased operating frequency via communication with the control unit 20 and the measurement units 18A-18C. For example, some embodiments of the measurement units 18A-18C may be programmable to select a desired operation frequency. Via the Meas_CTL to the measurement units 18A-18C, the PMU 22 may program the measurement units 18A-18C to measure the supply voltage for the increased operating frequency, and may let the supply voltage settle to the new voltage. The power management unit 22 may then program the PLL 24 to establish the increased operating frequency. If the operating frequency is to be decreased, the PMU 22 need not ensure settling to the new supply voltage prior to programming the PLL 24 to establish the decreased operating frequency.

The PMU 22 may change the operating frequency responsive to various inputs. For example, power management may generally be under software control and software may program the PMU 22 to change the operating frequency as desired. The PMU 22 may include registers 26 to provide the programmability. In other embodiments, the PMU 22 may monitor operation of the integrated circuit 12 and/or external signals indicating activity in the system 10 to change the operating frequency (e.g. lowering the operating frequency if less activity is detected or increasing the operating frequency if more activity is detected). The PMU 22 may also perform thermal monitoring to determine when to change frequencies. Any combination of the above software and/or hardware mechanisms may be used.

In some embodiments, the PMU 22 may also be programmable at manufacture to associate specific supply voltages with specific operating frequencies (e.g. using the fuses 28). The fuses 28 may be selectively "blown" during test operations at manufacture to represent supply voltages at which the integrated circuit 12 is operable for various operating frequencies. The PMU 22 may be configurable to bypass the measurement units 18A-18C and establish the supply voltage indicated in the fuses 28 directly with the control unit 20 for a given operating frequency. The PMU 22 may be configured to bypass in various fashions (e.g. permanently bypass via the fuses 28, software programmable via the registers 26 to bypass, or configured via one or more input signals from pins on the integrated circuit 12 to bypass).

The voltage regulator 14 receives the V_CTL output from the integrated circuit 20 and generates a requested supply voltage indicated by the V_CTL input to the integrated circuit 12. The voltage regulator 14 may support any desired range of supply voltages and any step between voltages within the range. For example, steps of 0.1 volts, 0.05 volts, 0.025 volts, and 0.0125 volts may be supported in various embodiments. Steps of other sizes, smaller or larger than those listed, may also be supported. The step size is the increment between adjacent voltages in the range. Thus, a range of beginning at 0.5 volts and having a 0.1 volt step size may support supply voltages of 0.5 volts, 0.6 volts, 0.7 volts, etc. The V_CTL output may have any number of bits sufficient to encode the magnitude of each selectable supply voltage. For example, the smallest supported supply voltage magnitude may be encoded as all zeros on V_CTL, the next smallest supported supply voltage magnitude may be encoded as all zeros except for bit 0, which may be a one, etc.

It is noted that, while the PMU 22 is shown providing measurement control (Meas_CTL) to each of the measurement units 18A-18C, the measurement units 18A-18C may not be programmable in other embodiments. For example, some measurement units 18A-18C may provide static measurements of the supply voltage (e.g. a supply voltage that ensures the required value of saturation current as mentioned above). In still other embodiments, some measurement units 18A-18C may be programmable while other measurement circuits 18A-18C are not programmable. In some embodiments, the measurement units 18A-18C may not all have the same design. In other embodiments, the measurement units 18A-18C may be of the same design.

In other embodiments, the PMU 22 may not be included. The control unit 20 and the measurement units 18A-18C may initially set the operating voltage based on the measured voltage for the desired operating frequency, and may adjust the current supply voltage as detected for operating temperature changes, if any.

Figure 2:
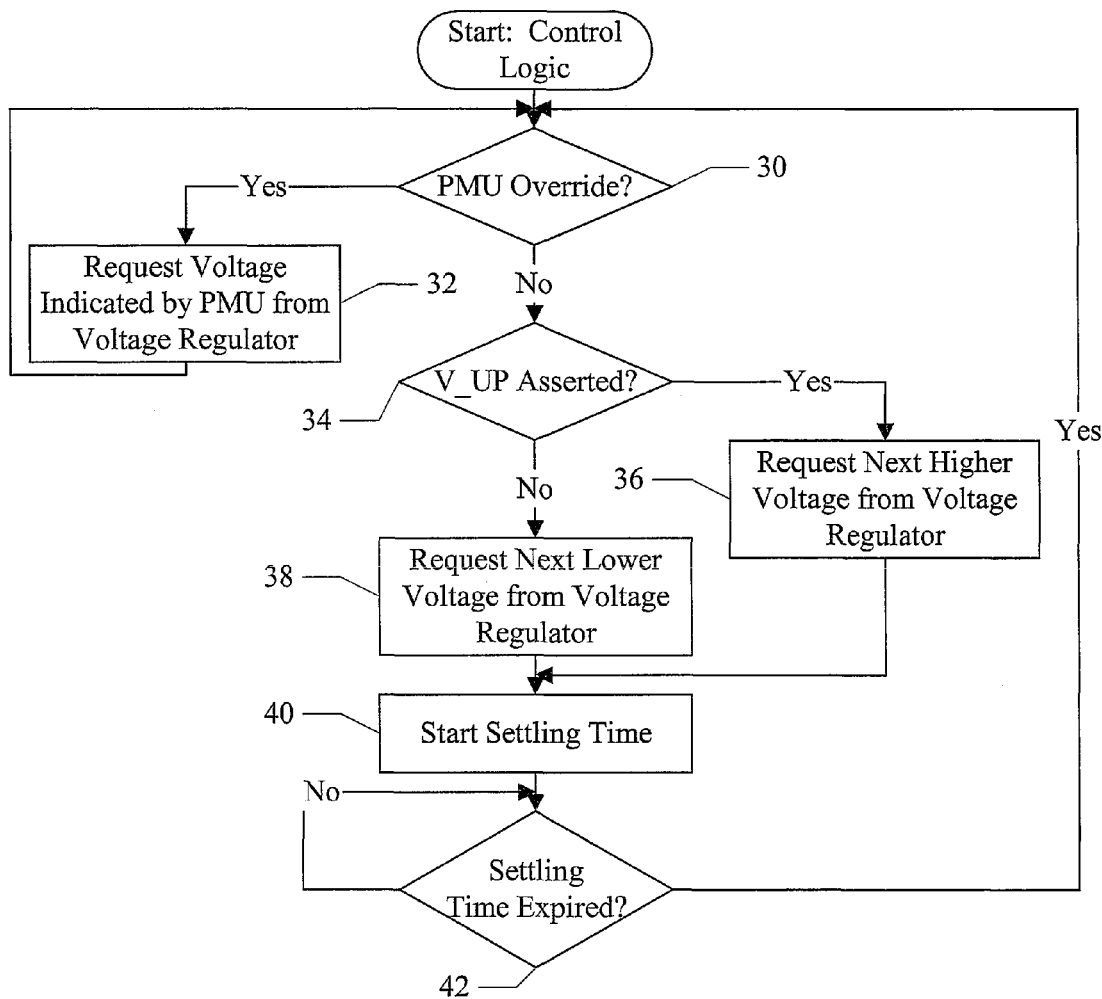
FIG. 2 is a flowchart illustrating operation of one embodiment of a control unit within the integrated circuit that generates a voltage control input to the voltage regulator.

Turning now to FIG. 2, a flowchart illustrating operation of one embodiment of the control unit 20 is shown. While the blocks are shown in a particular order for ease of understanding in FIG. 2, any order may be used. Furthermore, blocks may be implemented in parallel in combinatorial logic in the control unit 20. Other blocks, portions of the flowchart, or the flowchart as a whole may be pipelined over multiple clock cycles, in various embodiments.

If the PMU 22 is overriding the measurement units 18A-18C (decision block 30, "yes" leg), the PMU 22 may also provide the desired supply voltage to the control logic 20. The control logic 20 may request the desired supply voltage from the voltage regulator 14 (block 32). In the embodiment of FIG. 1, the control logic 20 may encode the magnitude of the desired voltage on the V_CTL output to the voltage regulator 14.

If the PMU 22 is not overriding the measurement units 18A-18C (decision block 30, "no" leg), the control unit 20 may determine if at least one of the V_UP signals from the measurement units 18A-18C is asserted (decision block 34). If at least one of the V_UP signals is asserted (decision block 34, "yes" leg), the control unit 20 may request the next higher supply voltage than the current supply voltage from the voltage regulator 14 (block 36). That is, the control unit 20 may increment the requested supply voltage by the step size supported by the voltage regulator 14 (block 36). If none of the V_UP signals is asserted (decision block 34, "no" leg), it is possible that the current supply voltage is higher than required for the correct operation of the integrated circuit 12. Thus, the control unit 20 may request the next lower voltage than the current supply voltage from the voltage regulator 14 (block 38).

In some embodiments, the control unit 20 may delay additional voltage changes for a period of time (the "settling time") to allow the voltage regulator to settle to the newly requested supply voltage. For example, a number of clock cycles of delay may be implemented, where the number of clock cycles of delay provides a period that is at least long enough to permit settling. Implementing a settling time is optional and may be eliminated in other embodiments. If a settling time is implemented, the control logic 20 may start timing the settling time (block 40). Once the settling time expires (decision block 42, "yes" leg), the control unit 20 may attempt another voltage change.

If a multiple step voltage change is to performed for the embodiment of FIG. 2, each step may be established in succession until the desired supply voltage is reached. For example, if the control unit 20 is increasing the supply voltage, each step in the increase may be established and the control unit 20 will still be receiving asserted V_UP signals from at least one of the measurement units 18A-18C, which causes the control unit 20 to increase the voltage by yet another step until each of the V_UP signals is deasserted. If the control unit 20 is decreasing the supply voltage, each step in the decrease may be established and none of the V_UP signals may be asserted, which causes the control unit 20 to decrease the voltage by yet another step until a V_UP signal is asserted.

The voltage control illustrated in FIG. 2 is but one exemplary embodiment. Other embodiments are contemplated as well, implementing various voltage control algorithms. For example, if the measurement units 18A-18C each also provide a V_DOWN signal in addition to a V_UP signal, the control unit 20 may increase the supply voltage if any V_UP signal is asserted but may decrease the supply voltage if none of the V_UP signals is asserted and more than a threshold number (fixed or programmable) of the V_DOWN signals are asserted. In another example, if more than a threshold number of V_UP signals are asserted, the control unit 20 may increase the requested supply voltage by multiple steps in one iteration to more rapidly approach the desired voltage. Similarly, the control unit 20 may decrease the requested supply voltage by multiple steps if more than a threshold number of V_DOWN signals are asserted, in embodiments that implement V_DOWN signals.

Figure 3:
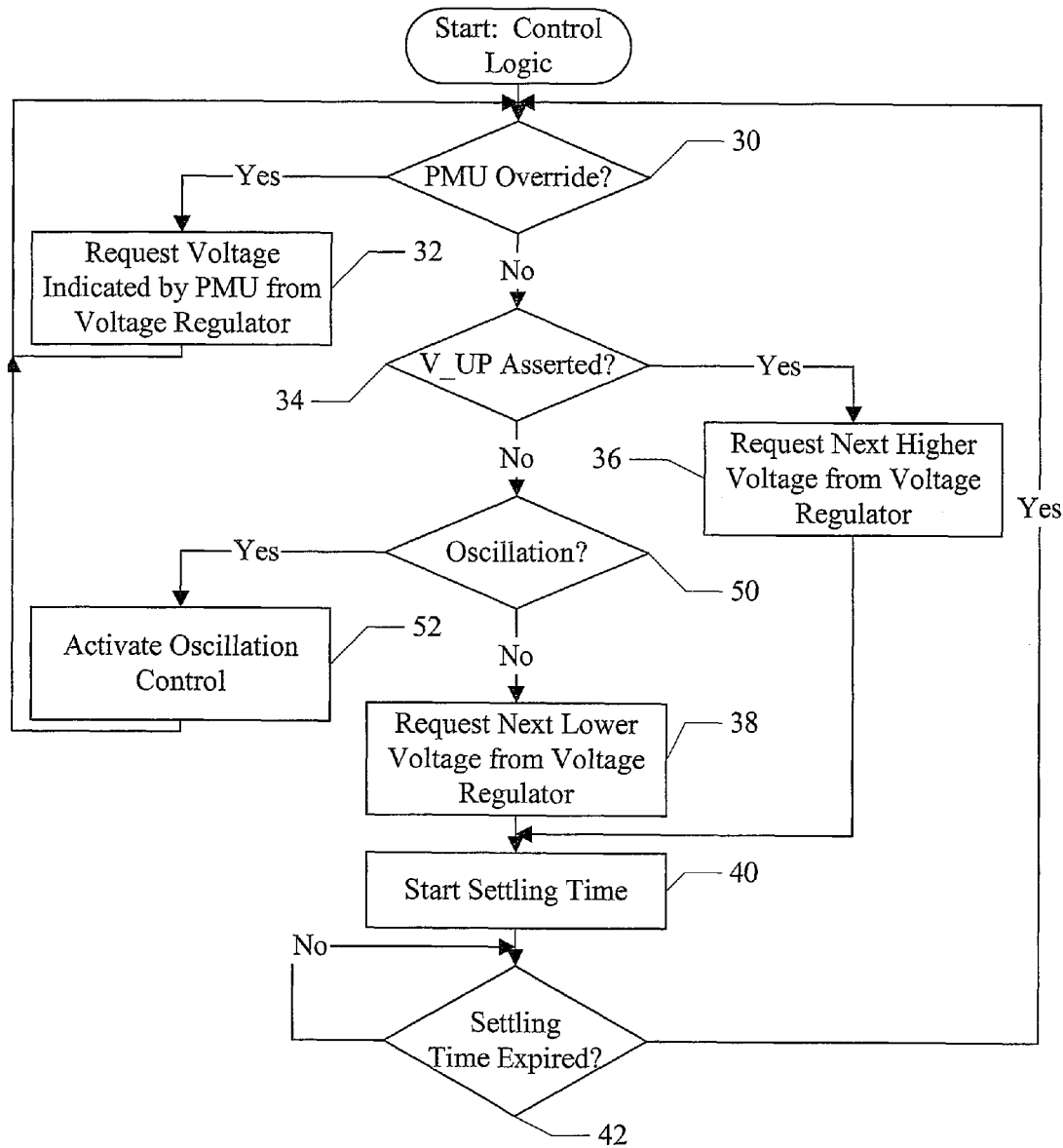
FIG. 3 is a flowchart illustrating operation of a second embodiment of a control unit within the integrated circuit that generates a voltage control input to the voltage regulator.

In the embodiment of FIG. 2, if the measured voltage detected by the measurement units 18A-18C is between two steps of the supply voltage, the control logic 20 oscillates between two steps in successive iterations once the supply voltage has neared the steady state condition of the measured voltage. If the supply voltage is at the step above the measured voltage, no V_UP signals may be asserted and the control unit 20 may reduce the requested supply voltage. If the supply voltage is at the step below the measured voltage, at least one V_UP signal may be asserted and the control unit 20 may increase the requested supply voltage. If the steps are small, this small variation in the supply voltage may be acceptable. Some embodiments may be configured to detect the oscillation and hold the requested supply voltage at the higher voltage of the two voltages for which the oscillation occurs. FIG. 3 is a flowchart illustrating an embodiment similar to the embodiment of FIG. 2 that detects the oscillation and attempts to control it. While the blocks are shown in a particular order for ease of understanding in FIG. 3, any order may be used. Furthermore, blocks may be implemented in parallel in combinatorial logic in the control unit 20. Other blocks, portions of the flowchart, or the flowchart as a whole may be pipelined over multiple clock cycles, in various embodiments.

The embodiment of FIG. 3 may handle the PMU override (blocks 30 and 32) and the case in which at least one V_UP signal is asserted (decision block 34, "yes" leg and block 36) in a similar fashion to the embodiment of FIG. 2. Additionally, the optional settling time may be implemented after each voltage change (blocks 40 and 42). However, if the control logic 20 detects that no V_UP signals are asserted (decision block 34, "no" leg), the control logic 20 may determine if oscillation between two consecutive steps is detected (decision block 50). Oscillation may be detected, for example, if N consecutive evaluations of the requested voltage have resulted in a pattern of increase, decrease, increase, decrease, etc. The number (N) of consecutive evaluations used to detect oscillation may vary in various embodiments. If oscillation is detected (decision block 50, "yes" leg), the control logic may activate oscillation control (block 52). Oscillation control may generally comprise freezing the requested supply voltage at its current magnitude (which is the greater of the two steps for which oscillation is detected). The freeze may be maintained, e.g., for a period of time (fixed or programmable) or until one of the V_UP signals is asserted, whichever occurs first. If oscillation is not detected (decision block 50, "no" leg), the control unit 20 may request the next lower voltage than the current supply voltage (block 38).

In other embodiments, the control unit 20 may be configured to filter the signals from the power measurement units 18A-18C to control supply voltage changes. The filter may sample the signals from the power measurement units 18A-18C. Any desired sampling frequency may be used. For example, the sampling frequency may be selected to be high enough to provide a representative set of samples, but also lower than the bandwidth of the circuitry in the measurement units 18A-18C (e.g. a voltage comparator, in some embodiments). In one implementation, a sampling frequency in the range of 10 to 100 MHz may be used, although wider ranges and/or higher or lower frequency ranges may be used in other implementations.

The filter may accumulate the samples over a desired sample range, which may be any size. Particularly, a sample range of a power of 2 may be selected, in some embodiments. For example, 256 samples may be implemented in one embodiment. Accumulating the samples may include adding a 1 for each sampled V_UP signal assertion, and a zero for each sampled V_UP deassertion (or V_DOWN assertion, if V_DOWN signals are implemented as well). The sum over the sample range may be compared to the size of the sample range to make a voltage change decision. For example, if the sum is greater than or equal to 85% of the sample range size (e.g. 256, for 256 samples), the requested voltage may be increased by 2 steps over the current voltage. If the sum is 60% to 85% of the sample range size, the requested voltage may be increased by 1 step over the current voltage. If the sum is 40% to 60% of the sample range size, no voltage change is requested. If the sum is between 15% and 40% of the sample range size, the requested voltage may be decreased by 1 step from the current voltage. If the sum is below 15% of the sample range size, the requested voltage may be decreased by two steps from the current voltage. Other embodiments may implement more or fewer percentage ranges (and corresponding steps of increase) and/or may vary the selected percentage ranges from those given above.

The above embodiment may provide a certain amount of noise filtering by requesting no change in the 40% to 60% range. Additionally, more rapid reaction to larger voltage change requirements may be provided by implementing two step increases/decreases when the measurement units are consistently indicating the same direction.

Figure 4:
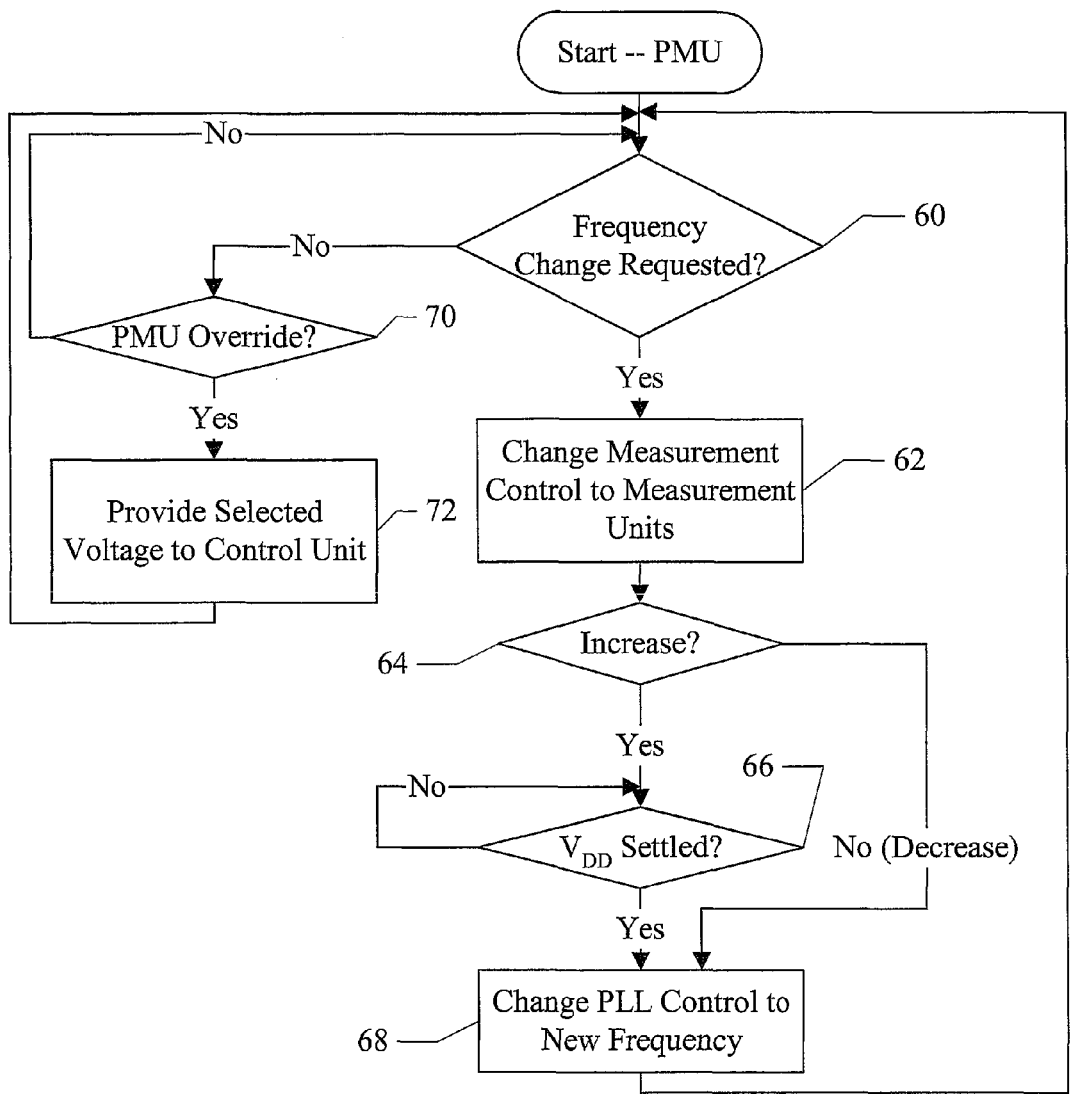
FIG. 4 is a flowchart illustrating operation of one embodiment of a power management unit within the integrated circuit.

Turning now to FIG. 4, a flowchart illustrating operation of one embodiment of the PMU 22 is shown. While the blocks are shown in a particular order for ease of understanding in FIG. 4, any order may be used. Furthermore, blocks may be implemented in parallel in combinatorial logic in the PMU 22. Other blocks, portions of the flowchart, or the flowchart as a whole may be pipelined over multiple clock cycles, in various embodiments.

If a frequency change has been requested (decision block 60, "yes" leg), the PMU 22 may change the measurement control (Meas_CTL in FIG. 1) to the measurement units 18A-18C to reflect the newly desired operating frequency (block 62). A frequency change may be requested in a variety of fashions, as mentioned above. For example, software may request a frequency change by writing one or more registers in the PMU 22. The PMU 22 may include hardware to monitor activity in the integrated circuit 12 and/or signals from the system 10. A combination of hardware and software techniques may be used.

If the frequency change is an increase in the operating frequency from the current operating frequency (decision block 64, "yes" leg), the PMU 22 may wait for the current supply voltage ($V_{DD}$) to settle to the voltage measured for the increased operating frequency (decision block 66). Since the measurement units 18A-18C have already been updated to measure for the increased operating frequency, the supply voltage should begin increasing if needed. The PMU 22 may communicate with the control unit 20 to determine if the supply voltage has settled. If the frequency change is a decrease in the operating frequency (decision block 64, "no" leg) or the supply voltage has settled for the desired operating frequency, the PMU 22 may change the configuration of the PLL 24 to establish the newly desired operating frequency for the core circuitry 16 (block 68).

If a frequency change has not been requested (decision block 60, "no" leg), the PMU 22 may also determine if it is overriding the measurement units 18A-18C with fused values for the supply voltage. If the PMU 22 is overriding the measurement units 18A-18C (decision block 70, "yes" leg), the PMU 22 may provide the selected voltage (indicated in the fuses 28) to the control unit 20 (block 72).

In one embodiment, the PMU 22 may be configured to program one or more of the measurement units 18A-18C to measure a supply voltage for a predicted operating frequency or frequencies, rather than a current operating frequency or a requested operating frequency. For example, if the current operating frequency is decreased (e.g. for power management), the PMU 22 may predict that the previous operating frequency will be requested again when the workload of the integrated circuit 12 increases again and higher performance is needed. Similarly, if the current operating frequency is increased, the PMU 22 may predict that the previous operating frequency will be requested again to reduce power consumption. Alternatively, if the current operating frequency is increased, the PMU 22 may predict that the next higher operating frequency will be requested as the integrated circuit 12 ramps up to handle an increased workload. Multiple previous operating frequencies may be used to predict the next operating frequency using more elaborate prediction algorithms.

By programming the measurement units 18A-18C with predicted operating frequencies, the integrated circuit 12 may, in some embodiments, be aware a priori of the supply voltage to request if the predicted operating frequency is requested, based on the output of the measurement units 18A-18C. In some embodiments, multiple measurement units 18A-18C may be programmed with the same predicted operating frequency. In other embodiments, different measurement units 18A-18C may be programmed with different predicted operating frequencies. In such embodiments, for example, predicted operating frequencies greater than and less than the current operating frequency may be programmed. In either case, some of the measurement units 18A-18C may remain programmed with the current operating frequency to continue adjusting the requested supply voltage at the current operating frequency. The control unit 20 may be programmed with which measurement units 18A-18C are measuring supply voltages for predicted operating frequencies, and may not adjust the requested supply voltage in response to outputs from those measurement units 18A-18C until the predicted operating frequency is requested. Additionally, in some embodiments, the measurement units 18A-18C that are measuring supply voltages for predicted frequencies may output a direct indication of the measured voltage (e.g. an encoding directly representing the measured voltage) so that the measured voltage may be requested if the predicted operating frequency is requested.

Figure 4A:
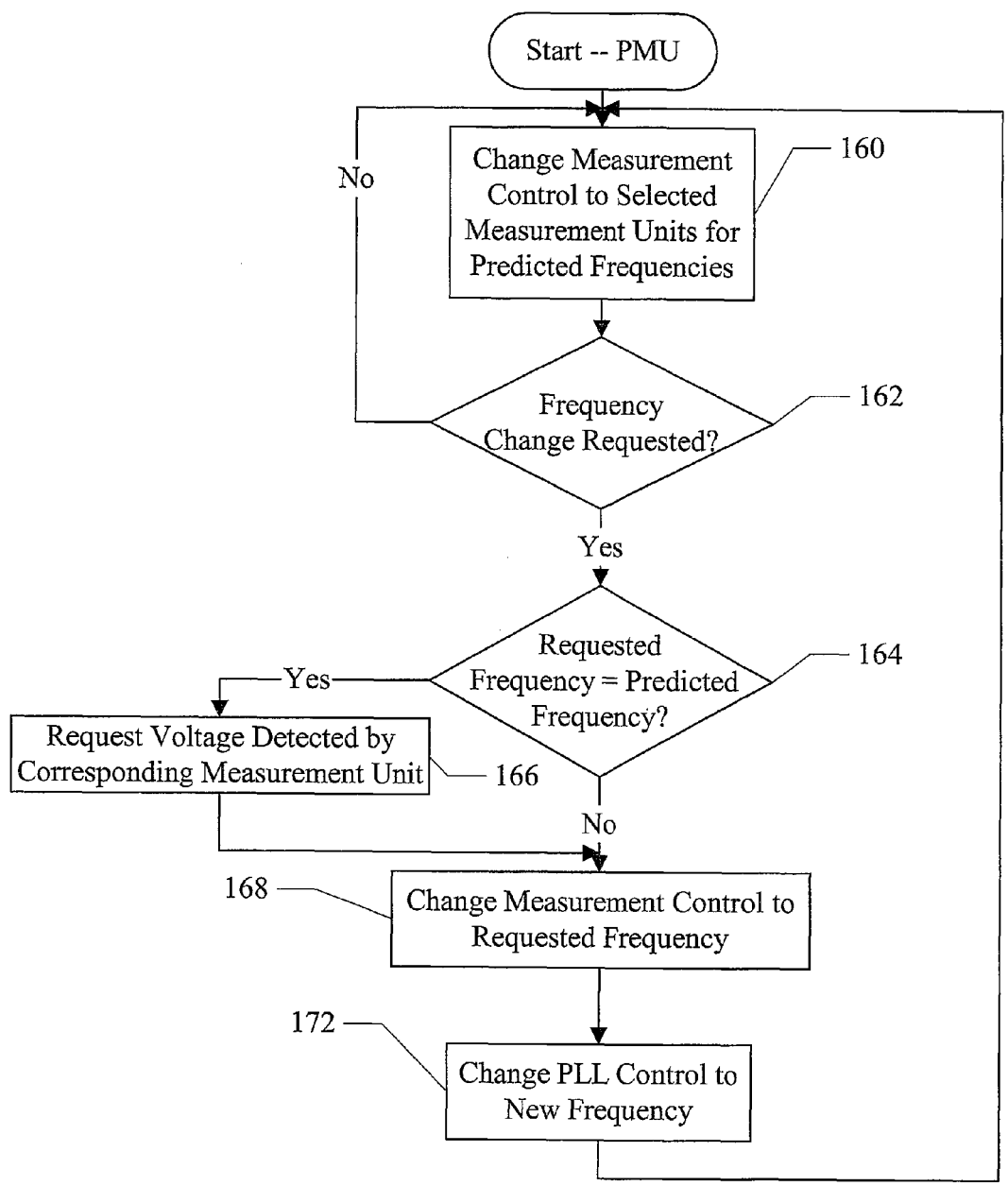
FIG. 4A is a flowchart illustrating operation of another embodiment of a power management unit within the integrated circuit.

Turning now to FIG. 4A, a flowchart illustrating operation of another embodiment of the PMU 22 and control unit 20 is shown. While the blocks are shown in a particular order for ease of understanding in FIG. 4A, any order may be used. Furthermore, blocks may be implemented in parallel in combinatorial logic in the PMU 22 and/or control unit 20. Other blocks, portions of the flowchart, or the flowchart as a whole may be pipelined over multiple clock cycles, in various embodiments.

The PMU 22 may change the measurement control to one or more selected measurement units 18A-18C to program the selected measurement units 18A-18C to a predicted operating frequency or frequencies (block 160). If a frequency change is requested (decision block 162, "yes" leg), the PMU 22 may determine if the requested operating frequency is one of the predicted operating frequencies that have been programmed into the selected measurement units 18A-18C (decision block 164). If so, the PMU may signal the control unit 20, which may request the supply voltage detected by the corresponding measurement unit 18A-18C (block 166).

In either case, the PMU 22 may change the measurement control to the measurement units 18A-18C (or at least those measurement units not involved in detecting supply voltages for predicted frequencies) to program the measurement units for the requested frequency (block 168). The PMU 22 may subsequent change the PLL 24 control to change to the requested frequency (block 172).

The PMU 22 may control frequency change requests in other fashions as well. For example, the PMU 22 may implement at least two modes for frequency change operations, in one embodiment. In a "fast" mode, the PMU 22 may cause the control unit 20 to increase the requested voltage to the maximum voltage to implement a frequency change request. The integrated circuit 12 may be rapidly changed to the requested frequency, and the supply voltage may subsequently settle to a lower voltage through operation of the measurement units 18A-18C and the control unit 20. In the "fast" mode, power consumption may be increased due to the temporary increase of the supply voltage to a higher value than needed. In a "minimum power" mode, the PMU 22 may change the control inputs to the measurement units 18A-18C and wait for the supply voltage to settle, as described above, before changing the operating frequency to the requested frequency. In such an embodiment, the change to the requested frequency may be slower than the fast mode, but the power consumption may also be lower.

Figure 5:
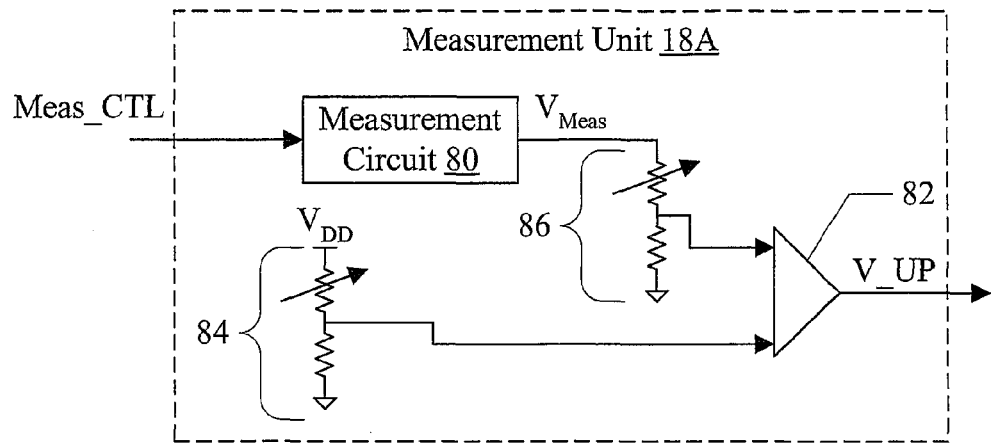
FIG. 5 is a block diagram of one embodiment of a measurement unit shown in FIG. 1.

FIG. 5 is a block diagram of one embodiment of the measurement unit 18A. Other measurement units 18B-18C may be similar, in some embodiments. In other embodiments, other measurement units 18B-18C may have different constructions. In the illustrated embodiment, the measurement unit 18A includes a measurement circuit 80, a comparator 82, a voltage divider 84, and a voltage divider 86. The measurement circuit 80 may be coupled to receive the measurement control input from the PMU 22, in some embodiments. The measurement circuit 80 is coupled to provide a measured voltage ($V_{Meas}$) to the voltage divider 86, which has an output coupled to the comparator 82. The comparator 82 is also coupled to receive the output of the voltage divider 84. The voltage divider 84 is supplied with the current supply voltage ($V_{DD}$). The comparator 82 is configured to generate the V_UP output signal to the control unit 20. In some embodiments, one or both of the voltage dividers 84 and 86 may be eliminated and the corresponding voltage $V_{DD}$ or $V_{Meas}$ may be coupled directly to the comparator 82 input.

In the illustrated embodiment, the comparator circuit 82 is configured to compare a first voltage derived from the measured voltage from the measurement circuit 80 to a second voltage derived from the current supply voltage (the outputs of the voltage divider 86 and 84, respectively, in the illustrated embodiment). The comparator circuit 82 is configured to assert the V_UP signal if the first voltage is greater than the second voltage. Otherwise, the comparator circuit 82 may deassert the V_UP signal. The comparator circuit 82 may comprise any voltage comparator.

The voltage divider 84 may be included to provide safety margin on the supply voltage. By comparing the measured voltage (or the first voltage) to the second voltage (somewhat less than the current supply voltage), the current supply voltage may settle to a voltage somewhat higher than the measured voltage. The difference between the measured voltage and the current supply voltage may be the margin. For example, if the voltage divider 84 provides an output that is 95% of the current supply voltage, a margin of 5% may be provided. The voltage divider 86 may provide margin in the opposite direction, e.g. to correct for inaccuracies in the measured voltage that cause the measured voltage to be higher than necessary. If the measured voltage is higher than desired, the voltage divider 86 may divide the measured voltage and cause $V_{DD}$ (or the second voltage) to settle on a voltage somewhat less than the measured voltage In the illustrated embodiment, the voltage dividers 84 and 86 are programmable to permit programming of the voltage margins. The voltage dividers may be programmed at manufacture (e.g. by blowing fuses), or during operation (e.g. via inputs to the integrated circuit, or controlled by the PMU 22, etc.).

Figure 9:
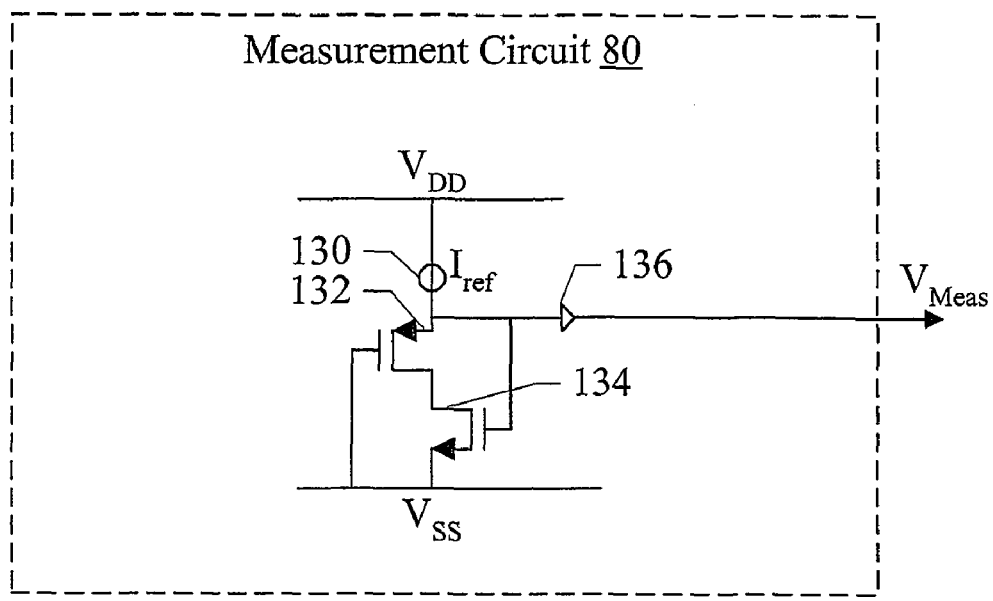
FIG. 9 is a block diagram of a third embodiment of a measurement circuit shown in FIG. 5.

The measurement circuit 80 is configured to measure the supply voltage that is the lowest measurable voltage (the minimum supply voltage) at which the integrated circuit 12 is expected to operate properly. A variety of embodiments of the measurement circuit 80 are contemplated. Examples are shown in FIGS. 6, 7, and 9.

Figure 6:
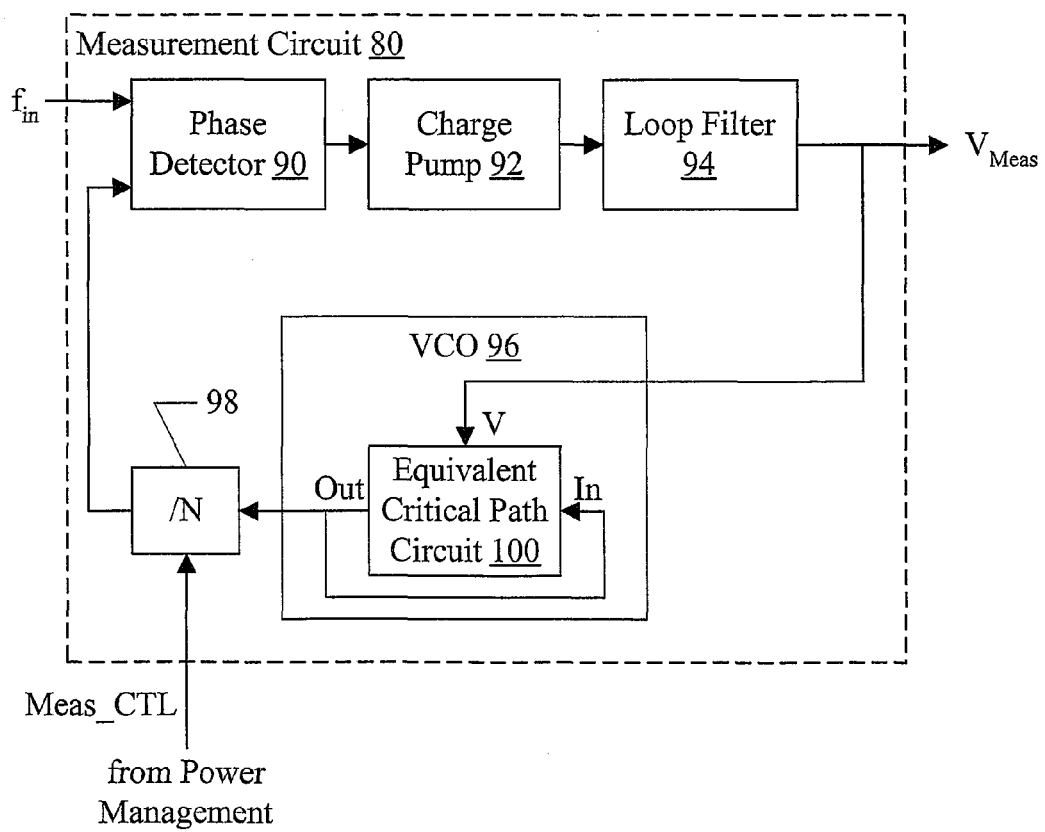
FIG. 6 is a block diagram of one embodiment of a measurement circuit shown in FIG. 5.
Figure 7:
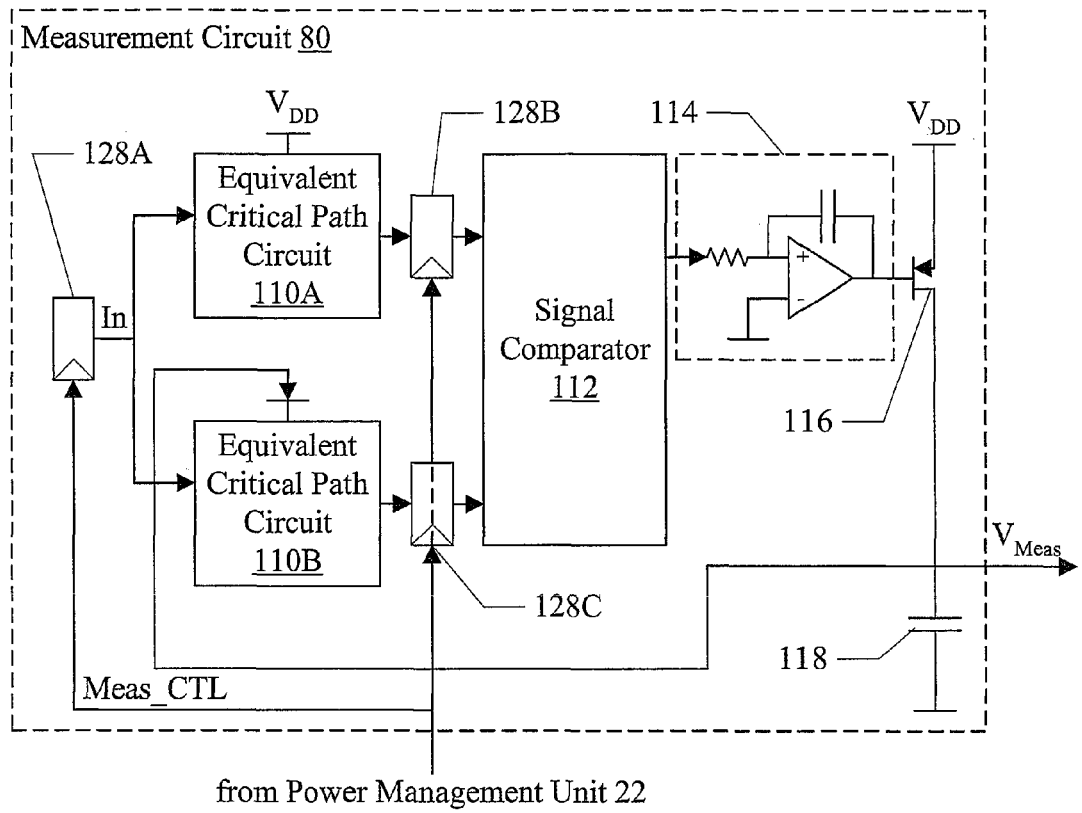
FIG. 7 is a block diagram of a second embodiment of a measurement circuit shown in FIG. 5.

In the embodiment of FIG. 6, the measurement circuit 80 comprises a PLL. Specifically, in the illustrated embodiment, the PLL includes a phase detector 90, a charge pump 92, a loop filter 94, a voltage controlled oscillator (VCO) 96, and a frequency divider 98. The phase detector 90 is coupled to receive a reference frequency ($f_{in}$) and the output of the frequency divider 98. The reference frequency may be the same reference frequency used by the PLL 24 in FIG. 1. The frequencies at which the PLL locks are multiples of the reference frequency, wherein the current multiple is equal to the divisor in the frequency divider 98. Thus, the measurement control from the PMU 22 in this embodiment may be a new value for the frequency divider 98 that depends on the operating frequency for which a measured voltage is desired.

When a given frequency is programmed into the PLL via the frequency divider 98, the PLL locks to the given frequency. The VCO 96 comprises an equivalent critical path circuit 100 which models the delay of a critical path or paths in the integrated circuit 12. The control voltage input to the VCO 96 is the supply voltage to the equivalent critical path circuit 100, and the output of the equivalent critical path circuit 100 is coupled to the input of the equivalent critical path circuit 100 to form a ring oscillator in the illustrated embodiment. In this embodiment, either the equivalent critical path circuit 100 may include an odd number of inversions or an inverter may be placed in the feedback path from the output to the input.

Once lock is achieved in the PLL, the ring oscillator formed from the equivalent critical path circuit 100 is oscillating at the $N*f_{in}$ frequency (where N is the divisor programmed into the frequency divider 98). Since the equivalent critical path circuit 100 models the delay of the critical path, the control voltage to the VCO is the supply voltage at which the critical path evaluates in time to meet the desired operating frequency (that is, the critical path evaluates within the clock cycle at the desired operating frequency, and thus the integrated circuit 12 may be expected to operate as designed). Accordingly, the control voltage input to the VCO is also the measured voltage output from the measurement circuit 80 ($V_{Meas}$).

It is noted that, to produce one period of oscillation from the ring oscillator formed by the equivalent critical path circuit 100, the equivalent critical path circuit 100 evaluates twice (once to produce a rising edge of the oscillation, and once to produce the falling edge of the oscillation in response to the rising edge feeding back to the input). Accordingly, to measure the voltage at which the critical path evaluates within one period of a desired operating frequency, the frequency divider 98 may be programmed so that the PLL locks at a frequency that is ½ of the desired operating frequency. Alternatively, the equivalent critical path circuit 100 may model the delay of the critical path by implementing a delay that is ½ of the critical path delay, and the PLL may be programmed to lock at the desired operating frequency. The equivalent critical path circuit 100 may be constructed in a variety of fashions. Additional details of some embodiments are provided below with regard to FIG. 8.

It is noted that, in some embodiments, frequency margin may be provided to help ensure that the integrated circuit 12 operates correctly when the supply voltage is reduced based on the measurements made by the measurement units 18A-18C. For example, the reference frequency ($f_{in}$) may be somewhat higher than the frequency used to generate the clocks for the integrated circuit 12. For example, the reference frequency $f_{in}$ may be somewhat higher than the reference frequency supplied to the PLL 24. Alternatively, frequency margin may be provided using the same reference frequency $f_{in}$ for the measurement units 18A-18C and the PLL 24. For example, the frequency divider 98 may be programmed differently in the PLL 24 and the measurement units, causing the measurement units 18A-18C to measure a supply voltage for a frequency that is higher than the frequency at which the integrated circuit 12 will operate. The PLL 24 could be programmed with a frequency divider of 20, and the measurement units 18A-18C could be programmed with a frequency divider of 22, for example. In some embodiments, the frequency margin may be programmable (e.g. by writing the desired frequency margin to the registers 26). In one embodiment, the frequency margin may be absolute. That is, the frequency margin may be expressed in terms of a fixed additional frequency to be added to the requested frequency. For example, if the frequency margin were set to 200 MHz, the margin would be 200 MHz for any desired operating frequency. For a desired operating frequency of 500 MHz, the frequency provided to the measurement units 18A-18C would be 700 MHz. For a desired operating frequency of 2 GHz, the frequency provided to the measurement units 18A-18C would be 2.2 GHz. On the other hand, the frequency margin may be proportional to the desired operating frequency. For example, the frequency margin may be expressed as a percentage of the desired operating frequency. In such embodiments, the frequency margin may vary in absolute measure based on the requested operating frequency. Still other embodiments may be programmable to use either proportional or absolute frequency margin. In yet another embodiment, a combination may be used (e.g. proportional margin with a floor of a fixed absolute frequency margin). Still further, in some embodiments, different measurement units may be programmed with different frequency margins. It is noted that, while positive voltage/frequency margin has been described above, negative margin may also be used. For example, if the measurement circuits 18A-18C are too pessimistic in their measurements, negative margin may produce supply voltages that are nearer to the minimum voltage that could be used.

The operation of the PLL may be as follows: The phase detector 90 detects phase differences between the output of the frequency divider 98 and the reference frequency. If a phase difference is detected, the phase detector 90 controls the charge pump 92 to either increase or decrease the control voltage on the control voltage input to the VCO 96. If the reference frequency is ahead, the phase detector 90 may increase the control voltage and if the reference frequency is behind, the phase detector 90 may decrease the control voltage. The control voltage may be filtered by the loop filter 94, and supplied to the VCO 96. The output of the VCO 96 (the output of the ring oscillator formed by the equivalent critical path circuit 100) is supplied as the input the frequency divider 98. Thus, when the PLL locks, the VCO 96 is oscillating at N times the reference frequency (and in phase with the reference frequency).

Turning now to FIG. 7, a second embodiment of the measurement circuit 80 is shown. In the embodiment of FIG. 7, two equivalent critical path circuits 110A-110B are included. The outputs of the equivalent critical path circuits 110A-110B are coupled as inputs to clocked storage devices 128B and 128C, which have outputs coupled as inputs to a signal comparator 112. The output of the signal comparator 112 is coupled to an integrator circuit 114. The output of the integrator circuit 114 is coupled to a gate terminal of an n-type metal-oxide-semiconductor (NMOS) transistor 116 which has its source coupled to the current supply voltage ($V_{DD}$) and its drain coupled to the measured voltage output node (labeled $V_{Meas}$). A capacitor 118 is also coupled between the measured voltage output node and ground. The measured voltage is provided as the supply voltage to the equivalent critical path circuit 110B. The equivalent path circuit 110A is supplied with the current supply voltage ($V_{DD}$). The equivalent critical path circuits 110A-110B are both coupled to receive the same input (In), which is launched from a clocked storage device 128A. The clocked storage devices 128-128C may be clocked according to the measurement control (Meas_CTL) from the PMU 22. In this embodiment, the measurement control may be a clock signal operating at the desired operating frequency. The PMU 22 may control a PLL similar to PLL 24 to supply the clock on the measurement control, in some embodiments.

The equivalent critical path circuit 110A, supplied with the current supply voltage, is known to evaluate in time for the integrated circuit 12 to operate correctly. Accordingly, the clocked storage device 128B may capture a correct result of the equivalent critical path circuit 110A's evaluation in response to the input signal. The equivalent critical path circuit 110B may or may not evaluate rapidly enough for correct operation, dependent on the current measured voltage ($V_{Meas}$). Thus, the clocked storage device 128C may or may not capture the same result as the clock storage device 128B captures on a given clock cycle. Since both circuits 110A-110B receive the same input, launched at the beginning of the clock cycle from the clocked storage device 128A, a mismatch in the results may indicate that the measured voltage is too low for correct operation at the desired operating frequency.

The signal comparator 112 compares the signals provided from the clocked storage devices 128B-128C. The signal comparator 112 may be a standard logic comparator, for example. If the measured voltage is not yet high enough to permit the correct output to be calculated by the circuit 110B at the desired operating frequency, a miscompare is detected by the signal comparator 112. The signal comparator 112 may assert an output signal to indicate miscompare and deassert the output signal to indicate correct compare. The asserted output of the signal comparator 112, integrated by the integrator circuit 114, may cause additional current to flow through the transistor 116 and increase the measured voltage. The integrator circuit 114 may accumulate the assertions of the signal comparator 112 output over time, increasing the measured voltage to an appropriate value that permits the circuit 110B to evaluate correctly. Furthermore, the integrator circuit 114 may reduce the measured voltage over time if the output of the signal comparator 112 is not asserted (no miscompare detected), lowering the measured voltage to its minimal level. The capacitor 118 may provide charge storage on the measured voltage output node, to provide stability of the measured voltage.

The clocked storage devices 128A-128C may be any type of storage devices that capture an input responsive to a clock signal (e.g. flops, latches, registers, etc.). It is noted that the In signal launched from the clocked storage device 128A may toggle each clock cycle to ensure that the circuits 110A-110B evaluate a different input each clock cycle. For example, the In signal may be inverted and supplied back to the input of the clocked storage device 128A. Alternatively, other logic (not shown in FIG. 7) may generate the input to the clocked storage device 128A, which is subsequently provided as the In signal output from the clocked storage device 128A.

The embodiments of FIGS. 6 and 7 both use equivalent critical path circuits (reference numerals 100 and 110A-110B, respectively). The equivalent critical path circuits may be constructed in a variety of fashions. For example, as the design of the integrated circuit 12 is finalized, one or more critical paths in the design may be identified via timing analysis tools. The critical paths may be extracted from the design, and the equivalent critical path circuits may be constructed with the same circuitry as the actual critical paths (and with the same amount of interconnect delay, or wire delay, between the circuitry). In other embodiments, the percentage of delay attributable to circuit delay (e.g. gate delay) and the percentage attributable to wire delay may be calculated for one or more critical paths. Equivalent critical path circuits that have circuitry providing the circuit delay percentage and interconnect providing the wire delay percentage may be provided.

Figure 8:
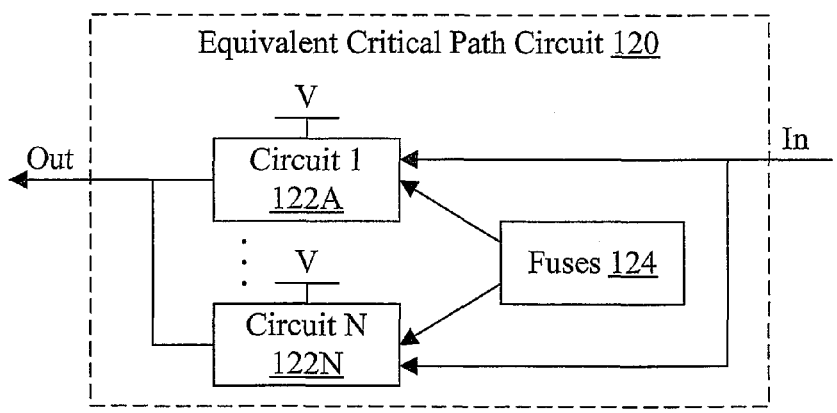
FIG. 8 is a block diagram of one embodiment of an equivalent critical path circuit shown in FIGS. 6 and 7.

Another embodiment of the equivalent critical path circuits is illustrated in FIG. 8 as an equivalent critical path circuit 120. In the embodiment of FIG. 8, the equivalent critical path circuit 120 includes N circuits 122A-122N. Each circuit is coupled to receive the same input to the equivalent critical path circuit 120 (In) and to provide the output (Out) of the equivalent critical path circuit 120. Each circuit 122A-122N is supplied with a supply voltage (V). The supply voltage (V) may be the supply voltage provided to the equivalent critical path circuit 120. For example, in FIG. 6, if the equivalent critical path circuit 120 is used as the circuit 100, the control voltage to the VCO may be the supply voltage (V). In FIG. 7, if the equivalent critical path circuit 120 is used as the circuit 110A, the supply voltage (V) may be the current supply voltage ($V_{DD}$). If the equivalent critical path circuit 120 is used as the circuit 110B, the supply voltage (V) may be the measured supply voltage ($V_{Meas}$). The equivalent critical path circuit 120 also includes a set of fuses 124 coupled to the circuits 122A-122N.

Each of the circuits 122A-122N may be designed to model the critical path delay with a different percentage of the delay attributable to circuit delay and to wire delay. For example, if four circuits 122 were included, one circuit may model the critical path delay as 100% circuit delay, 0% wire delay; a second circuit may model the critical path delay as 75% circuit delay, 25% wire delay; a third circuit may model the critical path delay as 50% circuit delay, 50% wire delay; and a fourth circuit may model the critical path delay as 25% circuit delay, 75% wire delay. Once the design of the integrated circuit 12 is finalized, the critical path or paths in the integrated circuit 12 may be characterized as to how much delay is attributable to circuit delay and wire delay. The circuit 122A-122N that most closely models the critical path delay(s) may be activated using the fuses 124. For example the fuses 124 may be blown during manufacture to enable one of the circuits 122A-122N and disable the other circuits 122A-122N. Other configurations are possible as well (e.g. fuses on the input and output of each circuit 122A-122N, selection circuitry on the output of the circuits 122A-122N with the selection control generated from the fuses, etc.).

In other embodiments, the circuits 122A-122N may be selectable by software rather than selected using the fuses 124, or may be selectable via hardware. For example, the selection of the circuits 122A-122N may be performed based on which of the circuits 122A-122N results in the lowest measured voltage that still results in correct operation of the integrated circuit 12.

FIG. 9 is a block diagram of a third embodiment of a measurement circuit 80. In the embodiment of FIG. 9, the measurement circuit 80 includes a current source 130 that supplies a reference current ($I_{ref}$) to a series connection of an NMOS transistor 132 and a PMOS transistor 134. The current source 130 is connected to a current supply voltage source ($V_{DD}$) and to the source of the NMOS transistor 132. The gate of the NMOS transistor 132 is connected to the ground (or $V_{SS}$) voltage source. The drain of the NMOS transistor 132 is connected to the drain of the PMOS transistor 134, which has its source connected to ground. The gate of the PMOS transistor 134 is connected to the source of the NMOS transistor 132, which is also connected to a buffer circuit 136. The output of the buffer circuit 136 is the measured voltage ($V_{Meas}$).

The measurement circuit 80 illustrated in FIG. 9 may statically measure the voltage at which the transistors 132 and 134 are provided with a required value of saturation current ($I_{dsat}$). Generally, the current source 130 may provide current to the series connection of the transistors 132 and 134, increasing the measured voltage until the required value of saturation current is reached in both transistors 132 and 134. The measurement circuit 80 of FIG. 9 may scale approximately with process characteristics, but may not be programmable for different desired frequencies. Supplying circuitry in the integrated circuit 14 with a supply voltage of $V_{Meas}$ may provide for saturation of the transistors in the circuitry, and thus may result in the circuitry evaluating reasonably quickly.

It is noted that, while the measurement circuit 80 embodiments shown in FIGS. 6, 7, and 9 may be included in measurement units such as measurement units 18A-18C, other embodiments may used the measured voltage ($V_{Meas}$) from any of the measurement circuits 80 as the supply voltage for other circuitry in the integrated circuitry directly. That is, the measured voltage may be used as the supply voltage rather than adjusting the supply voltage provided from the external voltage regulator 14. Generally, a supply voltage may be a voltage used to power circuitry.

Figure 10:
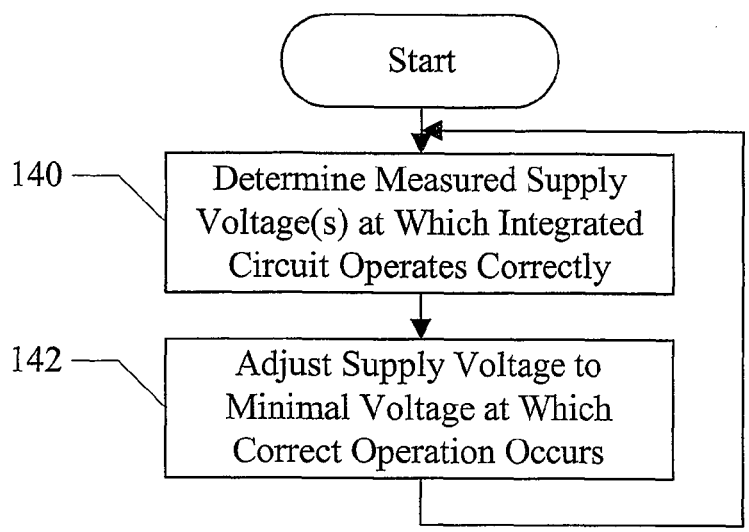
FIG. 10 is a flowchart illustrating a high level method of providing supply voltage to an integrated circuit.

Turning next to FIG. 10, a flowchart is shown illustrating a high level method for determining a supply voltage for an integrated circuit 12. The method shown in FIG. 10 may be performed during operation of the integrated circuit 12 in a system 10. The integrated circuit 10 may determine the measured supply voltage (or voltages, if multiple measurement units are included) at which the integrated circuit operates correctly for a given operating frequency (block 140). The supply voltage is adjusted to a minimal voltage at which correct operation is expected to occur in the integrated circuit 12 (block 142). Particularly, the integrated circuit 12 may output the requested supply voltage to the voltage regulator 14, which may provide the requested voltage as the supply voltage to the integrated circuit.

Figure 11:
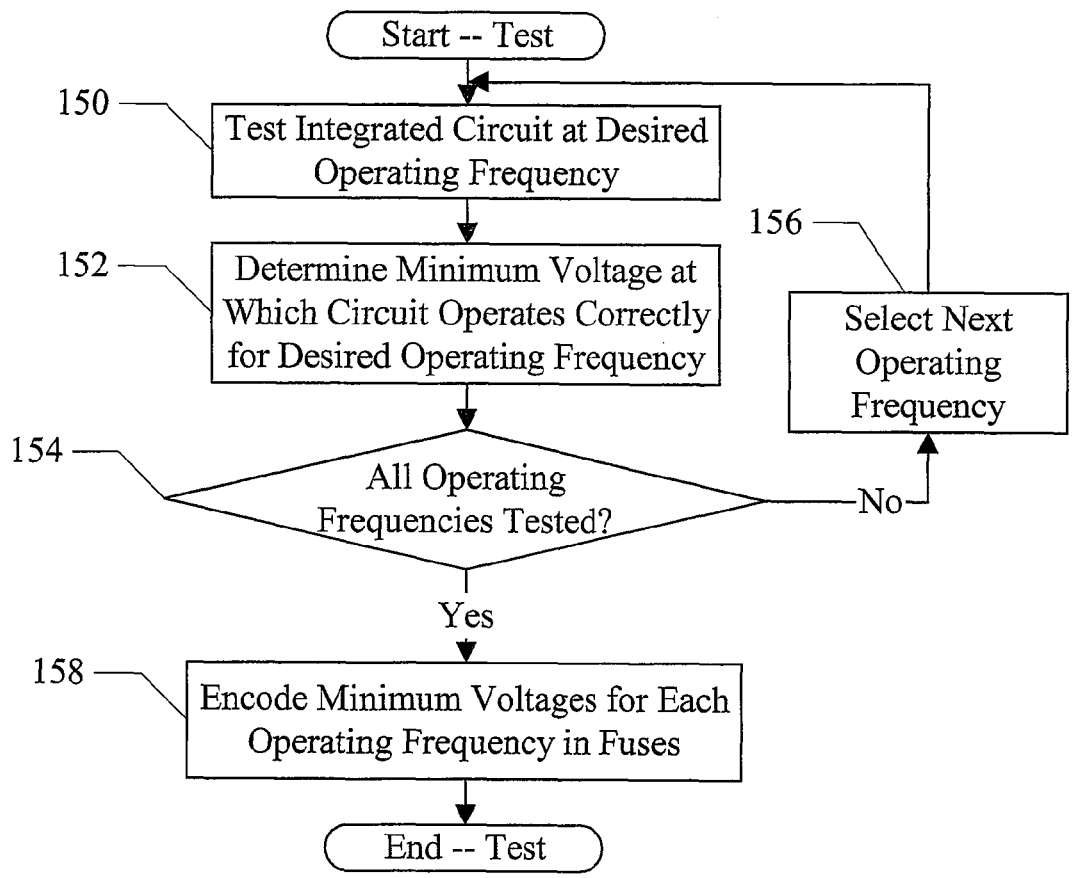
FIG. 11 is a flowchart illustrating a high level method that may be used during test of an integrated circuit.

Turning now to FIG. 11, a flowchart is shown illustrating certain steps that may be performed when an integrated circuit 12 is tested during manufacture of the integrated circuit 12. The steps shown in FIG. 11 may be performed if the PMU 22 is to be encoded with supply voltages to be used for various operating frequencies for bypassing of the measurement units 18A-18C.

The integrated circuit 12 may be tested at a desired operating frequency, with the highest supply voltage supported by the integrated circuit 12 (block 150). The test may determine if the integrated circuit 12 operates correctly at all at the desired operating frequency. The integrated circuit 12 may then be tested to determine the minimum voltage at which the integrated circuit operates correctly for the desired operating frequency (block 152). For example, tests that exercise one or more critical paths in the integrated circuit 12 may be performed repeatedly at different supply voltages and the results may be checked for correctness. If additional operating frequencies are to be tested (decision block 154, "no" leg), the next desired operating frequency is selected (block 156), and blocks 150 and 152 may be repeated. If all desired operating frequencies have been tested (decision block 154, "yes" leg), the minimum supply voltage for each operating frequency may be encoded in the fuses 28 (block 158).

Figure 12:
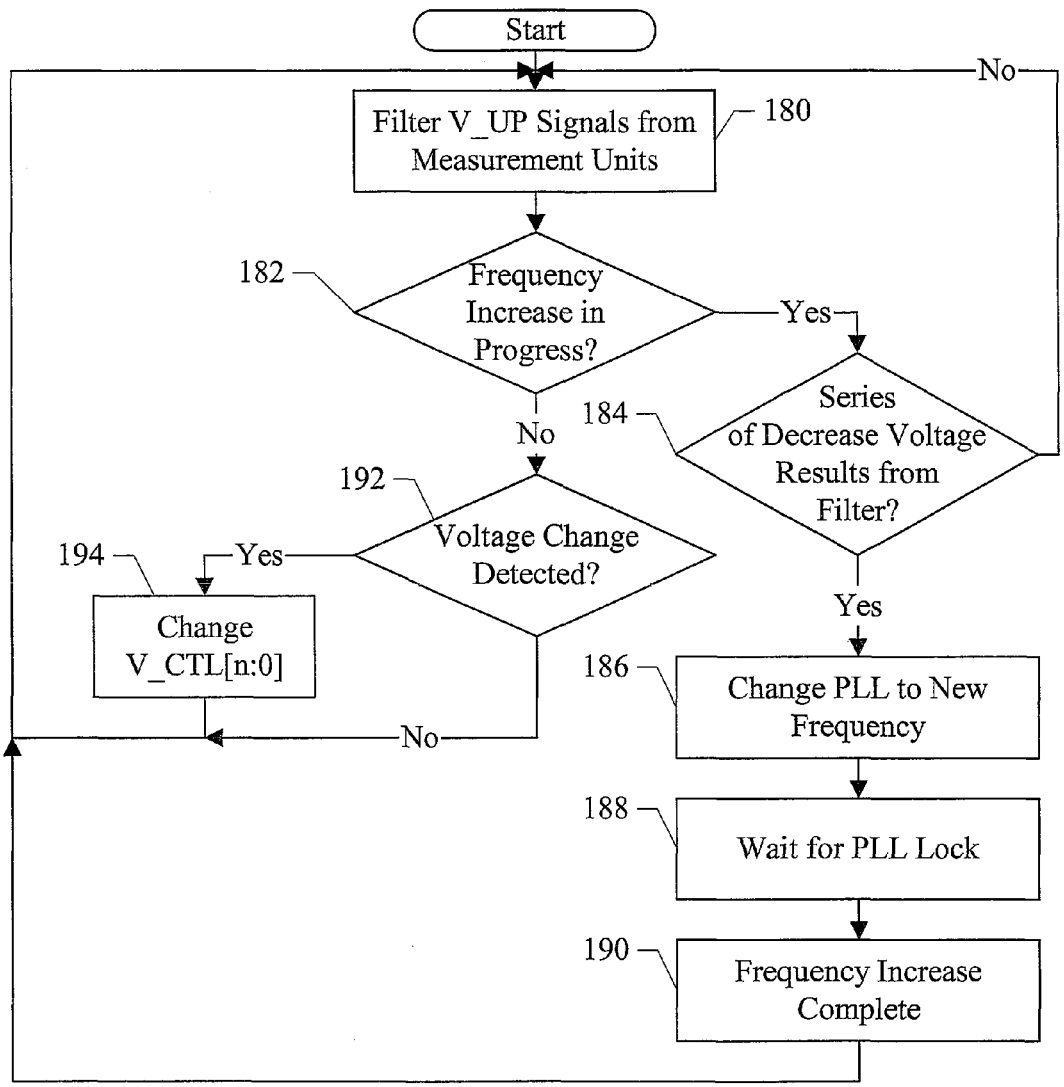
FIG. 12 is a flowchart illustrating operation of one embodiment of a control unit and/or power management unit shown in FIG. 1.

Turning now to FIG. 12, a flowchart illustrating operation of one embodiment of the control unit 20 and/or the PMU 22 is shown. While the blocks are shown in a particular order for ease of understanding in FIG. 12, any order may be used. Furthermore, blocks may be implemented in parallel in combinatorial logic in the control unit 20/PMU 22. Other blocks, portions of the flowchart, or the flowchart as a whole may be pipelined over multiple clock cycles, in various embodiments. The operation illustrated in FIG. 12 may be divided between the PMU 22 and the control unit 20 in any desired fashion (or may be implemented entirely in the control unit 20 or the PMU 22), and the control unit 20 may even be part of the PMU 22 in various embodiments. Thus, the allocation of operation to control unit 20 and PMU 22 in the discussion below is arbitrary and may be modified in other embodiments. Generally, a circuit may be designed to perform the operation illustrated in FIG. 12.

Figure 13:
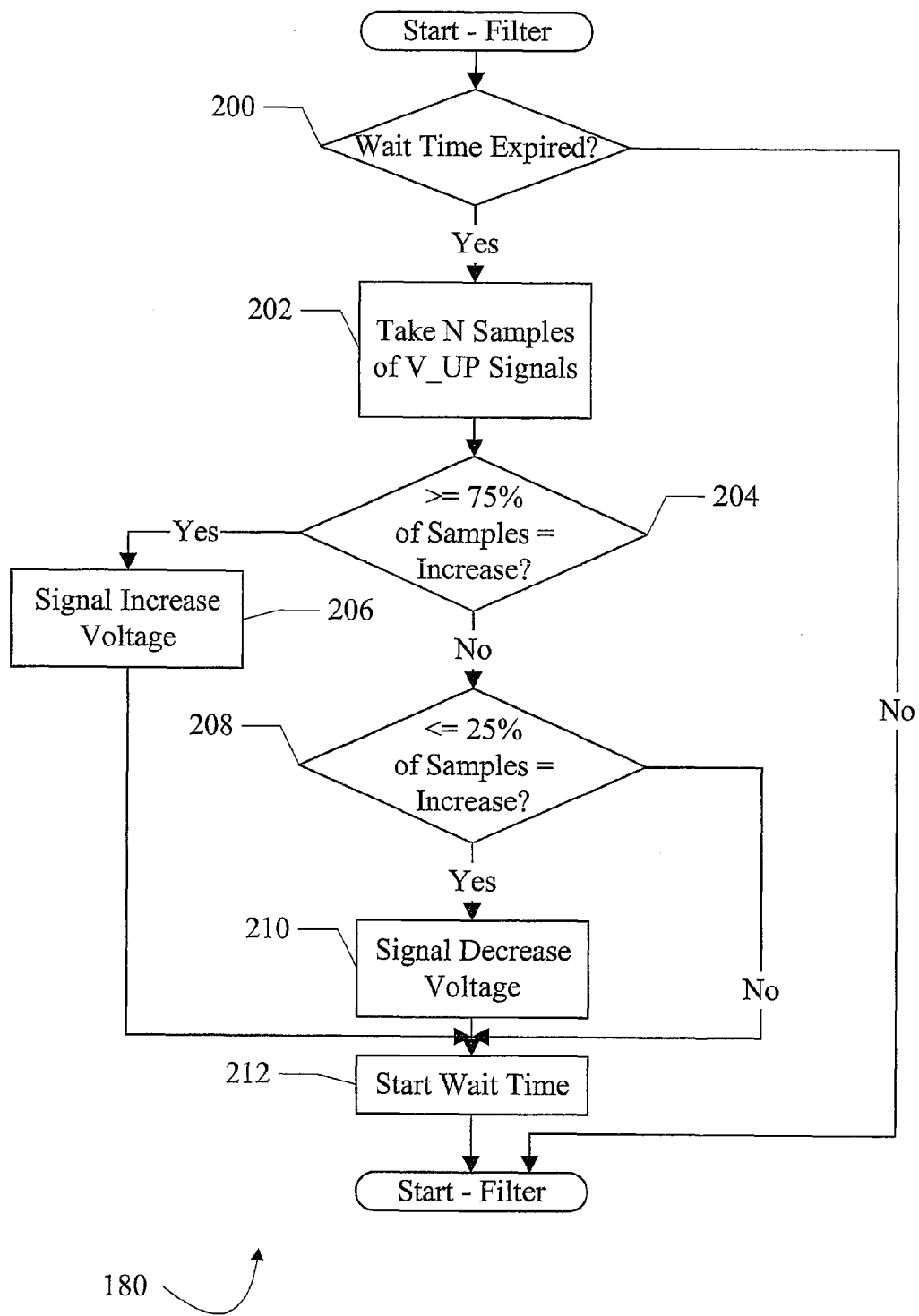
FIG. 13 is a flowchart illustrating one embodiment of a filter block shown in FIG. 12.

The control unit 20 may filter the V_UP signals from the measurement units 18A-18C (block 180). An example of filtering the signals is illustrated in FIG. 13 and described in more detail below. Generally, the control unit 20 may generate an increase voltage, decrease voltage, or no change result from the filtering. The filtering may be implemented, e.g., over a window of time that precedes the result generated by the control unit 20.

If an increase in the desired operating frequency is in progress (decision block 182, "yes" leg), the PMU 22 may await a series of decrease voltage results from the filter circuitry (decision block 184). In this fashion, the supply voltage may be increased to a level at which the new, higher operating frequency can be safely employed before the PLL 24 is reconfigured for the new frequency. Frequency decreases, since they should operate properly at a supply voltage that is safe for a higher operating frequency, may be implemented without a wait. In one embodiment, the series of decrease voltage results are detected to be consecutive. For example, one embodiment may wait for three consecutive decrease voltage results before adjusting the PLL 24 to the new frequency. Alternatively, the decrease voltage results need not be consecutive, but may include no more than one increase voltage result between any two decrease voltage results. Such an embodiment may permit oscillation between increase and decrease results once the measurement units 18A-18C have reached a safe level for the higher operating frequency, and may still detect that the safe level has been reached so that the PLL 24 may be configured for the new frequency. Additionally, such an embodiment may not count transient voltage decrease results that may occur while the supply voltage is still being increased to the safe level for determining that the safe level has been reached. In yet another alternative, the PMU 22 may simply detect two or more decrease voltage results. If the series of decrease voltage results have not been detected (decision block 184, "no" leg), the PMU 22 waits for additional filtered results to be provided. If the series has been detected (decision block 184, "yes" leg), the PMU 22 may change the PLL configuration for the PLL 24 to lock to the new frequency (block 186). The PMU 22 may stall for the PLL lock (block 188), and then the frequency increase is completed (block 190).

If an increase in the desired operating frequency is not in progress (decision block 182, "no" leg), the PMU 22 may determine if a voltage change is requested (block 192). The voltage change may be an increase voltage result or a decrease voltage result, and may be based on the measurement unit's output during a time that the operating frequency is not being changed (e.g. due to temperature variations, etc.). If a voltage change is detected (decision block 192, "yes" leg), the PMU 22 may modify the V_CTL output to the voltage regulator 14 (block 194). For example, the next higher (for an increase voltage result) or next lower (for a decrease voltage result) may be requested by generated a different encoding on the V_CTL output.

Turning next to FIG. 13, a flowchart is shown illustrating implementation of one embodiment of the filter block 180 shown in FIG. 12. While the blocks are shown in a particular order for ease of understanding in FIG. 13, any order may be used. Furthermore, blocks may be implemented in parallel in combinatorial logic in the control unit 20/PMU 22. Other blocks, portions of the flowchart, or the flowchart as a whole may be pipelined over multiple clock cycles, in various embodiments. The operation illustrated in FIG. 13 may be divided between the PMU 22 and the control unit 20 in any desired fashion (or may be implemented in its entirety in the control unit 20 or the PMU 22), and the control unit 20 may even be part of the PMU 22 in various embodiments. Thus, the allocation of operation to control unit 20 and PMU 22 in the discussion below is arbitrary and may be modified in other embodiments. Generally, a circuit may be designed to perform the operation illustrated in FIG. 13.

The control unit 20 may sample the V_UP signals periodically as part of the filtering, according to a timer. The timer may be programmable within a desired range (e.g. 10 microseconds to 10 milliseconds in one embodiment, although any range may be used in other embodiments). Thus, the control unit 20 may be idle if the wait time has not expired since the last sampling (decision block 200, "no" leg). The wait time may permit the newly requested supply voltage (if any) to settle before taking the next samples, in one embodiment. If the wait time has expired, the control unit 20 may sample the next N V_UP signals (block 202). That is, the control unit 20 may sample the V_UP signals for the next N clock cycles. N may be any desired sample size. For example, N may be 64. N may be 256 in another embodiment, as described previously. Any number of samples may be taken in various embodiments.

The control unit 20 may determine if the samples indicate an increase voltage or decrease voltage result. For example, in the illustrated embodiment, the increase voltage response may be generated if at least 75% of the samples indicate a voltage increase (decision block 204, "yes" leg and block 206). The samples are logical one (V_UP asserted) to indicate increase and logical zero (V_UP deasserted) to indicate no increase, in this embodiment. Thus, viewed in another way, the samples may be averaged and an increase voltage result may be detected if the average is greater than or equal to 0.75. The control unit 20 may similarly determine a decrease voltage result if less than or equal to 25% of the samples indicate a voltage increase (or an average of 0.25 or less is detected—decision block 208, "yes" leg and block 210). If the samples that indicate a voltage increase are between 25% and 75% of the total samples (decision blocks 204 and 208, "no" legs), no action is the result. The control unit 20 may start the wait timer again to await the next sampling time (block 212).

While 75% and 25% are used as thresholds in this embodiment, any thresholds may be used in other embodiments. If the number of samples indicating voltage increase is above the higher threshold, an increase voltage result may be determined. If the number of samples indicating voltage increase is below the lower threshold, a decrease voltage result may be detected. Having two thresholds permits a "middle" section in which stable voltage may be provided. More than two thresholds may be implemented in other embodiments as well, and larger increase voltage/decrease voltage results may be implemented.

In one embodiment, the sampling frequency may be lower than the operating frequency of the integrated circuit. For example, a sampling frequency of about 300 MHz may be used in one embodiment. Higher or lower sampling frequencies may be implemented in other embodiments.

Figure 14:
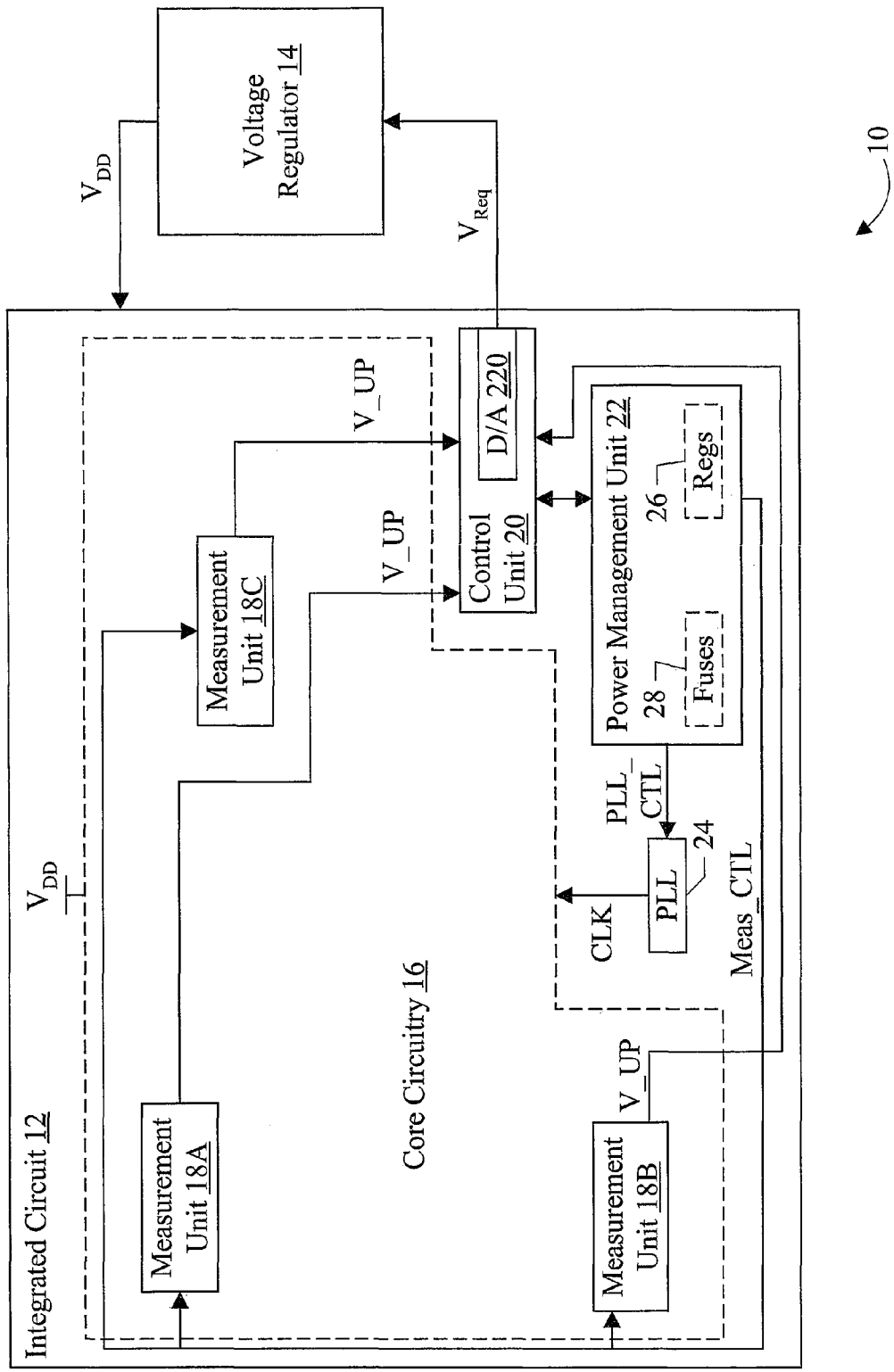
FIG. 14 is a block diagram of another embodiment of a system including an integrated circuit and a voltage regulator.

Turning next to FIG. 14, a block diagram of another embodiment of the system 10 is shown. The system 10 includes another embodiment of the integrated circuit 12 and the voltage regulator 14. In this embodiment, instead of a digital output V_CTL to the voltage regulator 14, the control unit 20 may generate the requested voltage itself as an analog output ($V_{Req}$ in FIG. 14). In such an embodiment, a less expensive voltage regulator 14 may be used that generates the supply voltage $V_{DD}$ to follow the requested voltage $V_{Req}$ (that is, $V_{DD}$ may be approximately equal to $V_{Req}$, once the voltage regulator settles in response to a change in $V_{Req}$). The voltage regulator 14 may still provide relative stability in the $V_{DD}$ supply voltage as supply current varies during operation, and thus the $V_{DD}$ supply voltage may be referred to as a "regulated voltage". In some embodiments, a lower overall cost for the system 10 may be realized. In the illustrated embodiment, the control unit 20 comprises a digital to analog (D/A) converter 220 that can convert from the digital V_CTL representation to the requested supply voltage $V_{Req}$. Alternatively, the V_CTL representation may not be generated, and the control unit 20 may generate the $V_{Req}$ voltage directly from the indications of the measurement units 18A-18C (and the current supply voltage $V_{DD}$).

Figure 15:
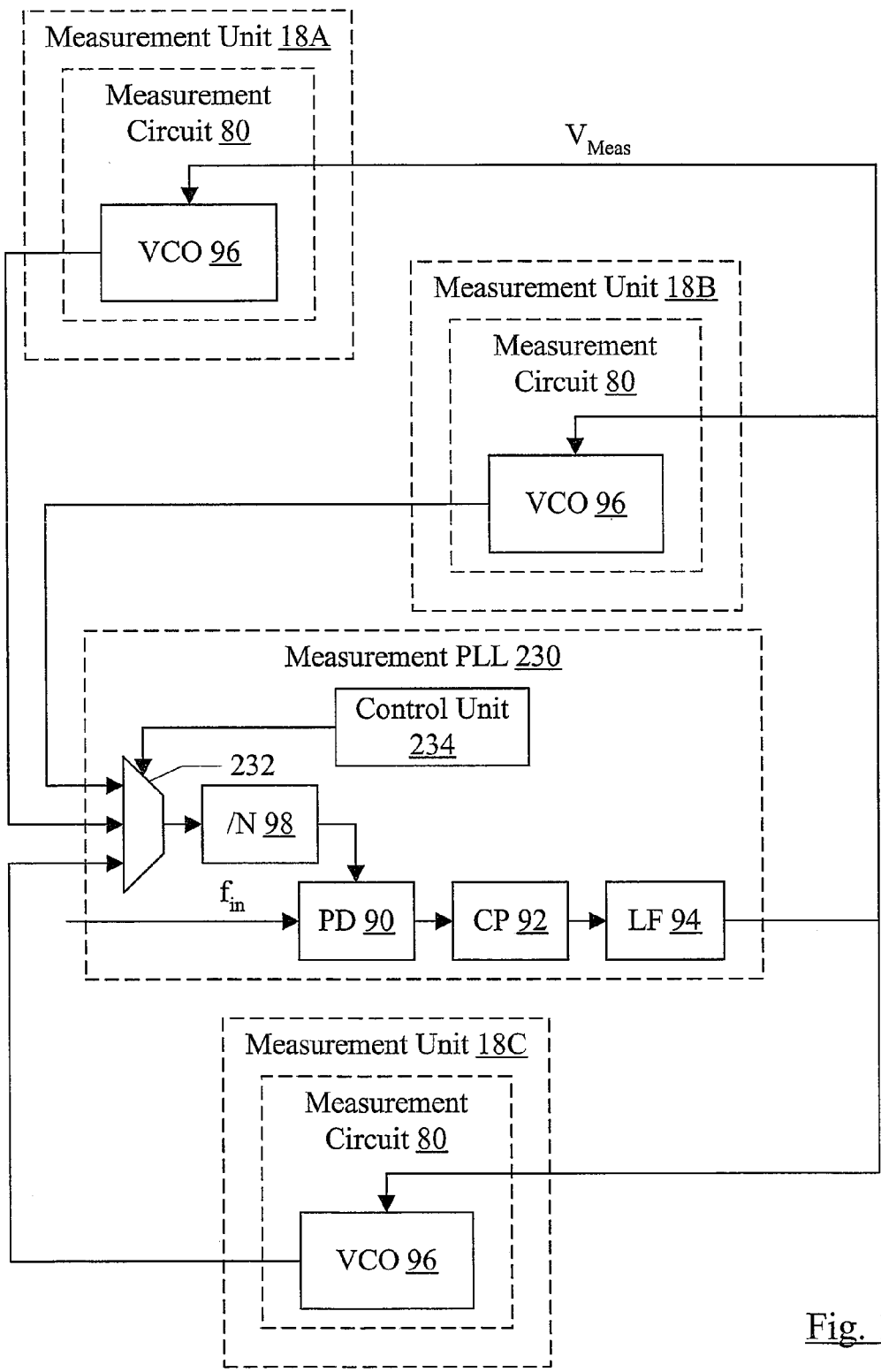
FIG. 15 is a block diagram of one embodiment of a set of measurement units and a measurement phase lock loop.

As described previously, in one embodiment the measurement units 80 may comprise PLLs that lock onto the desired operating frequency and provide the measured control voltage at lock for comparison the current supply voltage. PLLs may be fairly larger in terms of die area (and may also consume significant power). Accordingly, in one embodiment, a portion of the PLL circuitry may be shared between the measurement circuits 80. FIG. 15 is an example of such an embodiment. Area may be saved by sharing the PLL components among the measurement units 18A-18C.

Turning now to FIG. 15, a block diagram of one embodiment of the measurement units 18A-18C and a measurement PLL 230 is shown. The measurement PLL 230 comprises one or more PLL components, but excludes at least the VCO from the PLL. In the embodiment of FIG. 15, the measurement PLL includes the /N circuit 98, the phase detector (PD) 90, the charge pump (CP) 92, loop filter (LF) 94, similar to the embodiment shown in FIG. 6. The output of the loop filter 94, $V_{Meas}$, may be supplied to the measurement circuits 80 in each measurement unit 18A-18C as shown in FIG. 15 (in addition to being input to the compare circuitry in the measurement units 18A-18C as shown in FIG. 5). Specifically, $V_{Meas}$ may be the control voltage input to the VCO 96 in each measurement circuit 80. The oscillator output of the VCO 96 from each measurement circuit may be supplied back to the measurement PLL 230.

The measurement PLL 230 may receive the oscillator outputs from each VCO 96 in the measurement units 80 (e.g. as inputs to a mux 232). A control unit 234 is coupled to the select input of the mux 232, and the output of the mux 232 is the input to the /N circuit 98. Accordingly, by selecting one of the oscillator outputs from one of the VCOs 96, a PLL is formed from the PLL components in the measurement PLL 230 and the selected VCO 96. The PLL may lock to the reference frequency $f_{in}$, and the $V_{Meas}$ voltage may indicate the safe operating voltage detected by the measurement unit 18A-18C that includes the selected VCO 96.

The control unit 234 may implement any mechanism to select among the VCOs 96. For example, one embodiment may implement a time division multiplexing scheme including a set of time slots. Each time slot is assigned to one of the VCOs 96, and the oscillator output from the VCO 96 is selected when its time slot occurs. The time slots may have a length long enough to permit the PLL to lock to the reference frequency and for the output of the measurement unit 18A-18C to be sampled. In one embodiment, the control unit 234 may communicate which measurement unit 18A-18C is selected to the control unit 20. The control unit 20 may only sample the V_UP signal from the selected measurement unit 18A-18C.

While one measurement PLL 230 is shown in FIG. 15, other embodiments may implement two or more measurement PLLs 230, if desired. In some such embodiments, the measurement PLLs 230 may be physically distributed about the integrated circuit 12, and a given measurement PLL 230 may be shared among groups of measurement units 18A-18C that are physically located near that measurement PLL 230. Additionally, in some embodiments, other components besides the VCO 96 may be included in each measurement circuits 80 (not shared). For example, the /N circuit 98 may be included in the measurement circuits 80, in one embodiment.

Numerous variations and modifications will become apparent to those skilled in the art once the above disclosure is fully appreciated. It is intended that the following claims be interpreted to embrace all such variations and modifications.

What is claimed is:

1. An integrated circuit comprising:
a plurality of measurement units configured to determine whether or not a current supply voltage is to be modified to operate the integrated circuit at a given operating frequency; and
a circuit coupled to the plurality of measurement units, wherein the circuit is configured to generate a voltage control output for an external voltage regulator responsive to the plurality of measurement units, and wherein the voltage control output indicates a requested supply voltage for the integrated circuit, and wherein the requested supply voltage differs from the current supply voltage to the integrated circuit responsive to the plurality of measurement units indicating that the current supply voltage is to be modified for the given operating frequency, and wherein, to increase to the given operating frequency, the circuit is configured to detect two or more pluralities of samples from the plurality of measurement units that indicate a decrease of the current supply voltage, and wherein the circuit is configured to change a current operating frequency of the integrated circuit to the increased operating frequency responsive to detecting the two or more pluralities of samples.

2. The integrated circuit as recited in claim 1 wherein the circuit is configured to filter outputs of the plurality of measurement units.

3. The integrated circuit as recited in claim 2 wherein filtering the outputs comprises the circuit sampling the outputs.

4. The integrated circuit as recited in claim 1 wherein the circuit is configured to request the requested supply voltage greater than the current supply voltage responsive to a number of the plurality of samples that indicate an increase of the current supply voltage being greater than a first threshold.

5. The integrated circuit as recited in claim 4 wherein the circuit is configured to request the requested supply voltage lower than the current supply voltage responsive to a number of the plurality of samples that indicate an increase of the current supply voltage being lower than a second threshold.

6. The integrated circuit as recited in claim 5 wherein the second threshold is lower than the first threshold and the circuit is configured to not change the current supply voltage responsive to the number of the plurality of samples that indicate an increase of the current supply voltage being between the first threshold and the second threshold.

7. The integrated circuit as recited in claim 1 wherein the circuit is configured to generate a request for a modified supply voltage and to wait a period of time before sampling again.

8. The integrated circuit as recited in claim 7 wherein the period of time is programmable.

9. A method comprising:
sampling outputs of a plurality of measurement units in an integrated circuit, wherein the plurality of measurement units are configured to determine whether or not a current supply voltage is to be modified to operate the integrated circuit at a given operating frequency;
requesting a requested supply voltage for the integrated circuit, wherein the requested supply voltage differs from the current supply voltage to the integrated circuit responsive to the plurality of measurement units indicating that the current supply voltage is to be modified for the given operating frequency;
detecting two or more consecutive samples of the outputs from the plurality of measurement units that indicate a decrease of the current supply voltage; and
changing from a current operating frequency to the given operating frequency in the integrated circuit responsive to detecting the two or more consecutive samples.

10. The method as recited in claim 9 wherein the requested supply voltage is greater than the current supply voltage responsive to a number of the samples that indicate an increase of the current supply voltage being greater than a first threshold.

11. The method as recited in claim 10 wherein the requested supply voltage is lower than the current supply voltage responsive to a number of the samples that indicate an increase of the current supply voltage being lower than a second threshold.

12. The method as recited in claim 11 wherein the second threshold is lower than the first threshold and the method further comprises not changing the current supply voltage responsive to the number of the samples that indicate an increase of the current supply voltage being between the first threshold and the second threshold.

13. The method as recited in claim 9 further comprising:
generating a request for a modified supply voltage; and
waiting a period of time before sampling again.

14. The method as recited in claim 13 wherein the period of time is programmable.

15. An integrated circuit comprising:
a plurality of measurement units configured to determine whether or not a current supply voltage is to be modified to operate the integrated circuit at a given operating frequency; and a circuit coupled to the plurality of measurement units, wherein the circuit is configured to predict that a request to modify the given operating frequency of the integrated circuit to a different operating frequency than the given operating frequency will be received prior to the circuit receiving the request, and wherein the circuit is configured to program at least one measurement unit of the plurality of measurement units to determine whether or not the current supply voltage is to be modified to operate the integrated circuit at the different operating frequency responsive to predicting the different operating frequency.

16. The integrated circuit as recited in claim 15 wherein, responsive to receiving the request, the circuit is configured to request a different supply voltage determined by the at least one measurement unit.

17. The integrated circuit as recited in claim 16 wherein, responsive to receiving a request to change to a second different operating frequency, the circuit is configured to program the plurality of measurement units to determine whether or not the current supply voltage is to be modified to operate the integrated circuit at the second different operating frequency.

18. The integrated circuit as recited in claim 17 wherein the circuit is configured to delay requesting the different supply voltage until the plurality of measurement units determine whether or not the current supply voltage is to be modified.

19. The integrated circuit as recited in claim 18 wherein the circuit is configured not to delay changing to the different supply voltage responsive to the prediction being correct.

20. The integrated circuit as recited in claim 15 wherein the circuit is configured to predict the different operating frequency responsive to one or more previous operating frequencies at which the integrated circuit operated.

21. An integrated circuit comprising: a plurality of measurement units configured to determine whether or not a current supply voltage is to be modified to operate the integrated circuit at a given operating frequency; and a circuit coupled to the plurality of measurement units, wherein the circuit is configured to predict that the integrated circuit is to be changed to a different operating frequency than the given operating frequency, and wherein the circuit is configured to program at least one measurement unit of the plurality of measurement units to determine whether or not the current supply voltage is to be modified to operate the integrated circuit at the different operating frequency, and wherein the circuit is configured to program the plurality of measurement units to determine whether or not the current supply voltage is to be modified to operate the integrated circuit at a second different operating frequency responsive to receiving a request to change to the second different operating frequency, the second different operating frequency different from the different operating frequency that was predicted by the circuit, and wherein the circuit is configured to delay requesting a different supply voltage until the plurality of measurement units determine whether or not the current supply voltage is to be modified in response to being programmed to determine whether or not the current supply voltage is to be modified to operate the integrated circuit at the second different operating frequency.

22. The integrated circuit as recited in claim 21 wherein the circuit is configured not to delay changing to the different supply voltage responsive to the prediction being correct.

23. The integrated circuit as recited in claim 21 wherein the circuit is configured to predict the different operating frequency responsive to one or more previous operating frequencies at which the integrated circuit operated.

24. A method comprising: determining, in a plurality of measurement units, whether or not a current supply voltage is to be modified to operate an integrated circuit at a given operating frequency, wherein the integrated circuit includes the plurality of measurement units; and predicting a request to modify the given operating frequency of the integrated circuit to a different operating frequency than the given operating frequency prior to the circuit receiving the request; responsive to the predicting, programming at least one measurement unit of the plurality of measurement units to determine whether or not the current supply voltage is to be modified to operate the integrated circuit at the different operating frequency.

25. The method as recited in claim 24 further comprising:
receiving the request to change to the different operating frequency; and
responsive to receiving the request, requesting a different supply voltage determined by the at least one measurement unit.

26. The method as recited in claim 25 further comprising changing to the different supply voltage responsive to the prediction being correct without delaying for the plurality of measurement units to determine the different supply voltage.

27. The method as recited in claim 24 further comprising: receiving a request to change to a second different operating frequency different from the different operating frequency; and programming the plurality of measurement units to determine whether or not the current supply voltage is to be modified to operate the integrated circuit at the second different operating frequency.

28. The method as recited in claim 27 further comprising delaying requesting a different supply voltage until the plurality of measurement units determine whether or not the current supply voltage is to be modified.

29. The method as recited in claim 24 wherein the predicting is responsive to one or more previous operating frequencies at which the integrated circuit operated.

* * * * *